(12) United States Patent
Yoshikawa et al.

(10) Patent No.: US 7,800,214 B2
(45) Date of Patent: Sep. 21, 2010

(54) SEMICONDUCTOR DEVICE

(75) Inventors: Yasuhiro Yoshikawa, Tokyo (JP); Motoo Suwa, Tokyo (JP); Hiroshi Toyoshima, Tokyo (JP)

(73) Assignee: Renensas Electronics Corporation, Kanagawa (JP)

( * ) Notice: Subject to any disclaimer, the term of this patent is extended or adjusted under 35 U.S.C. 154(b) by 944 days.

(21) Appl. No.: 11/563,312

(22) Filed: Nov. 27, 2006

(65) Prior Publication Data
US 2007/0120245 A1    May 31, 2007

(30) Foreign Application Priority Data
Nov. 28, 2005  (JP)  ............................. 2005-342479

(51) Int. Cl.
*H01L 23/52* (2006.01)
*H01L 21/4763* (2006.01)

(52) U.S. Cl. ........................ 257/691; 257/700; 257/758; 257/774; 257/E23.011; 257/E23.019; 257/E23.07; 257/E23.151; 257/E21.499; 438/622

(58) Field of Classification Search ........................ None
See application file for complete search history.

(56) References Cited

U.S. PATENT DOCUMENTS

2003/0063453 A1 * 4/2003 Kusagaya et al. ............ 361/794
2006/0284296 A1 * 12/2006 Itano et al. ................... 257/678

FOREIGN PATENT DOCUMENTS

| JP | 11-135668 | 5/1999 |
| JP | 2001-203298 | 7/2001 |

* cited by examiner

*Primary Examiner*—Alonzo Chambliss
(74) *Attorney, Agent, or Firm*—Mattingly & Malur, P.C.

(57) ABSTRACT

Mutual inductance from an external output signal system to an external input signal system, in which parallel input/output operation is enabled, is reduced. A semiconductor integrated circuit has a plurality of external connection terminals facing a package substrate, and has an external input terminal and an external output terminal, in which parallel input/output operation is enabled, as part of the external connection terminals. The package substrate has a plurality of wiring layers for electrically connecting between the external connection terminals and module terminals corresponding to each other. A first wiring layer facing the semiconductor integrated circuit has a major wiring for connecting between the external input terminal and a module terminal corresponding to each other, and a second wiring layer in which the module terminals are formed has a major wiring for connecting between an external output terminal and a module terminal corresponding to each other. A major signal wiring of an external output system connected to the external output terminal, which may be a noise source, is made to be in a wiring layer distant from the semiconductor integrated circuit.

20 Claims, 29 Drawing Sheets

FIG. 4

| CPAD | | INDEX |
|---|---|---|
| BW0B | | BW2B |
| VR0S | | TRM4 |
| TRM0 | | TRM3 |
| BW1B | | BW3B |
| QDSEL | | SA |
| SA | | SA |
| SA | | SA |
| SA | | SA |
| SA | | SA |
| VSS | | VSS |
| CQ | | CQB |
| VDDQ | | VDDQ |
| VSS | | VSS |
| VDD | | VDD |
| Q17 | | Q18 |
| VSSQ | | VSS |
| D17 | | D18 |
| D8 | | D27 |
| VSSQ | | VSS |
| Q8 | | Q27 |
| Q16 | | D19 |
| VDDQ | | VDDQ |
| D16 | | Q19 |
| D7 | | D28 |
| VDDQ | | VDDQ |
| VSS | | VSS |
| Q7 | | Q28 |
| Q15 | | Q20 |
| VDDQ | | VDDQ |
| D15 | | D20 |
| D6 | | D29 |
| VDDQ | | VDDQ |
| VSS | | VSS |
| Q6 | | Q29 |
| Q14 | | Q21 |
| VDDQ | | VDDQ |
| D14 | | D21 |
| D5 | | D30 |
| VSS | | VSSQ |
| Q5 | | Q30 |
| VDD | | VDD |
| Q13 | | Q22 |
| VDDQ | | VDDQ |
| D13 | | D22 |
| VSS | | VSS |
| RB | | WB |
| VDDi | | BIMOD |
| KB | | KT |
| NC | | NC |

↓ A

A ↓

| | | |
|---|---|---|
| VREF | | VREF |
| CB | | CT |
| ZQ | | DOFFB |
| VSS | | VSS |
| D4 | | D31 |
| VDDQ | | VDDQ |
| Q4 | | Q31 |
| VDD | | VDD |
| Q12 | | Q23 |
| VSSQ | | VSS |
| D12 | | D23 |
| D3 | | D32 |
| VDDQ | | VDDQ |
| Q3 | | Q32 |
| Q11 | | Q24 |
| VSSQ | | VSS |
| VDDQ | | VDDQ |
| D11 | | D24 |
| D2 | | D33 |
| VDDQ | | VDDQ |
| Q2 | | Q33 |
| Q1 | | Q34 |
| VSSQ | | VSS |
| VDDQ | | VDDQ |
| D1 | | D34 |
| D10 | | D25 |
| VDDQ | | VDDQ |
| Q10 | | Q25 |
| Q9 | | Q26 |
| VSS | | VSS |
| D9 | | D26 |
| D0 | | D35 |
| VSS | | VSS |
| Q0 | | Q35 |
| VDD | | VDD |
| VSS | | VSS |
| VDDQ | | VDDQ |
| VDD | | NC |
| VSS | | VSS |
| SA | | TDO |
| SA | | SA |
| SA | | SA |
| SA | | SA |
| SA | | SA |
| SA | | SA |
| TMS | | SA |
| PORM | | SA |
| TDI | | TCK |

FIG. 5

|   | C12 | C11 | C10 | C9 | C8 | C7 | C6 | BMP | C5 | C4 INDEX | C3 |
|---|---|---|---|---|---|---|---|---|---|---|---|
| R00 | TRM2 | TRM1 | TRM0 | /BW1 | VR0S | FC | /BW2 | | | TRM3 | TRM4 |
| R01 | SA_9A | BLSEL | | /BW0 | /K | K | /BW3 | | | IOSEL2 | SA_3A |
| R02 | SA_10A | | QDSEL | /R | | | /W | | SA_4B | IOSEL1 | SA_2A |
| R03 | SA_8B | SA_7C | | | VDD | VDD | | | | SA_6C | SA_5C |
| R04 | D17 | VSS | CQ | VDDQ | VSS | VSS | VDDQ | | /CQ | VSS | D18 |
| R05 | D8 | | Q17 | | VDDQ | VDDQ | | | Q18 | | D27 |
| R06 | D16 | VSS | Q8 | VSS | VSS | VSS | VSS | | Q27 | VSS | D19 |
| R07 | D7 | | Q16 | | VDDQ | VDDQ | | | Q19 | | D28 |
| R08 | D15 | VDDQ | Q7 | VDDQ | VSS | VSS | VDDQ | | Q28 | VDDQ | D20 |
| R09 | C6 | VDDQ | Q15 | | VDDQ | VDDQ | | | Q20 | VDDQ | D29 |
| R10 | D14 | VDDQ | Q6 | VDDQ | VSS | VSS | VDDQ | | Q29 | VDDQ | D21 |
| R11 | D5 | | Q14 | VDDQ | VSS | VSS | VDDQ | | Q21 | | D30 |
| R12 | | VDDQ | Q5 | VDDQ | VDD | VDD | VDDQ | | Q30 | VDDQ | |
| R13 | D13 | | Q13 | VDDI | VSS | VSS | BiMOD | | Q22 | | D22 |
| R14 | VSS | VDDQ | ZQ | VREF2 | | | VREF1 | | /DOFF | VDDQ | VSS |
| R15 | D4 | | Q4 | | VSS | VSS | | | Q31 | | D31 |
| R16 | | VDDQ | Q12 | VDDQ | VDD | VDD | VDDQ | | Q23 | VDDQ | |
| R17 | D12 | | Q3 | VDDQ | VSS | VSS | VDDQ | | Q32 | | D23 |
| R18 | D3 | VDDQ | Q11 | VDDQ | VSS | VSS | VDDQ | | Q24 | VDDQ | D32 |
| R19 | D11 | VDDQ | Q2 | | VDDQ | VDDQ | | | Q33 | VDDQ | D24 |
| R20 | D2 | VDDQ | Q1 | VDDQ | VSS | VSS | VDDQ | | Q34 | VDDQ | D33 |
| R21 | D1 | | Q10 | | VDDQ | VDDQ | | | Q25 | | D34 |
| R22 | D10 | VSS | Q9 | VSS | VSS | VSS | VSS | | Q26 | VSS | D25 |
| R23 | D9 | | Q0 | | VDDQ | VDDQ | | | Q35 | | D26 |
| R24 | D0 | VSS | VDDM | VDDQ | VSS | VSS | VDDQ | | | VSS | D35 |
| R25 | SA_8P | SA_7N | | | VDD | VDD | | | TDO | SA_5N | SA_3R |
| R26 | SA_9R | SA_7P | | | | | | | SA_6N | SA_5P | SA_4P |
| R27 | SA_8R | SA_7R | SCSEL | | /C | C | | | PRST | PUPF | SA_4R |
| R28 | PTCK | TMS | PORM | TDI | PORC | PTDI | TCK | | | SA_5R | |

FIG. 6

BLL

| Row | 1 (INDEX) | 2 | 3 | 4 | 5 | 6 | 7 | 8 | 9 | 10 | 11 |
|-----|-----------|------|------|------|------|-----|------|------|------|------|------|
| A | /CQ | SA | SA | /W | /BW2 | /K | /BW1 | /R | SA | SA | CQ |
| B | Q27 | Q18 | D18 | SA | /BW3 | K | /BW0 | SA | Q17 | Q17 | Q8 |
| C | D27 | Q28 | D19 | VSS | SA | SA | SA | VSS | D16 | Q7 | D8 |
| D | D28 | D20 | Q19 | VSS | VSS | VSS | VSS | VSS | Q16 | D15 | D7 |
| E | D29 | D29 | Q20 | VDDQ | VSS | VSS | VSS | VDDQ | Q15 | D6 | Q6 |
| F | Q30 | D21 | D21 | VDDQ | VDD | VSS | VDD | VDDQ | D14 | Q14 | Q5 |
| G | D30 | D22 | Q22 | VDDQ | VDD | VSS | VDD | VDDQ | Q13 | D13 | D5 |
| H | /DOF | VREF | VDDQ | VDDQ | VDD | VSS | VDD | VDDQ | VDDQ | VREF | ZQ |
| J | D31 | Q31 | D23 | VDDQ | VDD | VSS | VDD | VDDQ | D12 | Q4 | D4 |
| K | Q32 | D32 | Q23 | VDDQ | VDD | VSS | VDD | VDDQ | Q12 | D3 | Q3 |
| L | Q33 | Q24 | D24 | VSS | VSS | VSS | VSS | VDDQ | D11 | Q11 | Q2 |
| M | D33 | D34 | D25 | VSS | SA | SA | SA | VSS | D11 | Q1 | D2 |
| N | D34 | D26 | Q25 | SA | SA | C | SA | VSS | Q10 | D9 | D1 |
| P | Q35 | D35 | Q26 | SA | SA | /C | SA | SA | Q9 | D0 | Q0 |
| R | TDO | TCK | SA | | | | SA | SA | SA | TMS | TDI |

FIG. 23

|  | D18 | D19 | D20 | D21 | D22 | D27 | D28 | D29 | D30 |
|---|---|---|---|---|---|---|---|---|---|
| Q18 | 0.98 | 0.37 | 0.16 | -0.22 | -0.23 | 0.84 | 0.31 | -0.04 | -0.18 |
| Q19 | 0.37 | 0.93 | 0.52 | -0.06 | -0.15 | 0.46 | 0.61 | 0.22 | -0.07 |
| Q20 | 0.05 | 0.36 | 0.75 | 0.17 | -0.06 | 0.15 | 0.47 | 0.50 | 0.05 |
| Q21 | -0.09 | 0.04 | 0.29 | 0.66 | 0.32 | -0.01 | 0.17 | 0.67 | 0.59 |
| Q22 | -0.21 | -0.15 | -0.02 | 0.77 | 0.75 | -0.17 | -0.07 | 0.19 | 0.55 |
| Q27 | 0.98 | 0.52 | 0.27 | -0.18 | -0.21 | 1.20 | 0.49 | 0.03 | -0.15 |
| Q28 | 0.82 | 0.81 | 0.57 | -0.12 | -0.21 | 0.79 | 0.77 | 0.18 | -0.12 |
| Q29 | 0.05 | 0.23 | 0.63 | 0.33 | 0.11 | 0.17 | 0.48 | 0.81 | 0.33 |
| Q30 | -0.09 | -0.02 | 0.15 | 0.58 | 0.62 | -0.02 | 0.11 | 0.38 | 1.05 |
| ΣMQ | 3.65 | 3.44 | 3.38 | 3.09 | 2.67 | (3.82) | 3.48 | 3.03 | 3.09 |

(nH)                                                                Worst

FIG. 24

|  | D18 | D19 | D20 | D21 | D22 | D27 | D28 | D29 | D30 |
|---|---|---|---|---|---|---|---|---|---|
| Q18 | 1.33 | 0.69 | 0.32 | -0.13 | -0.15 | 0.98 | 0.53 | 0.13 | -0.10 |
| Q19 | 0.58 | 1.27 | 0.60 | -0.03 | -0.10 | 0.60 | 0.79 | 0.30 | -0.02 |
| Q20 | 0.15 | 0.39 | 0.86 | 0.31 | 0.01 | 0.20 | 0.58 | 0.69 | 0.15 |
| Q21 | -0.02 | 0.07 | 0.34 | 0.88 | 0.41 | 0.02 | 0.27 | 0.68 | 1.04 |
| Q22 | -0.16 | -0.10 | 0.05 | 0.78 | 0.77 | -0.12 | 0.01 | 0.22 | 0.61 |
| Q27 | 1.32 | 0.72 | 0.36 | -0.09 | -0.12 | 1.42 | 0.61 | 0.18 | -0.06 |
| Q28 | 0.94 | 0.96 | 0.72 | -0.05 | -0.12 | 0.73 | 1.11 | 0.35 | -0.03 |
| Q29 | 0.14 | 0.25 | 0.69 | 0.66 | 0.22 | 0.20 | 0.62 | 0.96 | 0.53 |
| Q30 | -0.02 | 0.05 | 0.29 | 0.79 | 0.48 | 0.03 | 0.26 | 0.50 | 1.41 |
| ΣMQ | 4.66 | 4.50 | 4.22 | 3.71 | 2.37 | 4.31 | (4.78) | 4.02 | 3.93 |

(nH)                                                                Worst

FIG. 29

|     | D18  | D19   | D20   | D21   | D22   | D27   | D28   | D29   | D30   |
|-----|------|-------|-------|-------|-------|-------|-------|-------|-------|
| Q18 | 0.98 | 0.37  | 0.16  | -0.22 | -0.23 | 0.84  | 0.31  | -0.04 | -0.18 |
| Q19 | 0.37 | 0.93  | 0.52  | -0.06 | -0.15 | 0.46  | 0.61  | 0.22  | -0.07 |
| Q20 | 0.05 | 0.36  | 0.75  | 0.17  | -0.06 | 0.15  | 0.47  | 0.50  | 0.05  |
| Q21 | -0.09| 0.04  | 0.29  | 0.66  | 0.32  | -0.01 | 0.17  | 0.67  | 0.59  |
| Q22 | -0.21| -0.15 | -0.02 | 0.77  | 0.75  | -0.17 | -0.07 | 0.19  | 0.55  |
| Q27 | 0.98 | 0.52  | 0.27  | -0.18 | -0.21 | 1.20  | 0.49  | 0.03  | -0.15 |
| Q28 | 0.82 | 0.81  | 0.57  | -0.12 | -0.21 | 0.79  | 0.77  | 0.18  | -0.12 |
| Q29 | 0.05 | 0.23  | 0.63  | 0.33  | 0.11  | 0.17  | 0.48  | 0.81  | 0.33  |
| Q30 | -0.09| -0.02 | 0.15  | 0.58  | 0.62  | -0.02 | 0.11  | 0.38  | 1.05  |
| ΣMQ | 3.65 | 3.44  | 3.38  | 3.09  | 2.67  | 3.82  | 3.48  | 3.03  | 3.09  |

(nH)

|  | D18 | D19 | D20 | D21 | D22 | D27 | D28 | D29 | D30 |
|---|---|---|---|---|---|---|---|---|---|
| Q18 | (0.90) | 0.35 | 0.15 | -0.23 | -0.24 | (0.70) | 0.30 | -0.04 | -0.18 |
| Q19 | 0.38 | 0.93 | 0.54 | -0.04 | -0.14 | 0.48 | 0.59 | 0.26 | -0.05 |
| Q20 | 0.05 | 0.36 | 0.75 | 0.18 | -0.04 | 0.18 | 0.46 | 0.52 | 0.07 |
| Q21 | -0.09 | 0.05 | 0.32 | 0.67 | 0.32 | 0.01 | 0.18 | 0.69 | 0.59 |
| Q22 | -0.22 | -0.15 | -0.01 | 0.76 | 0.75 | -0.16 | -0.07 | 0.19 | 0.53 |
| Q27 | (0.97) | 0.51 | 0.25 | -0.19 | -0.22 | (1.05) | 0.47 | 0.02 | -0.16 |
| Q28 | 0.84 | 0.80 | 0.56 | -0.12 | -0.21 | 0.84 | 0.79 | 0.19 | -0.11 |
| Q29 | 0.04 | 0.21 | 0.61 | 0.35 | 0.13 | 0.19 | 0.46 | 0.80 | 0.37 |
| Q30 | -0.09 | -0.01 | 0.18 | 0.59 | 0.61 | 0.00 | 0.13 | 0.41 | 1.03 |
| ΣMQ | 3.58 | 3.37 | 3.37 | 3.12 | 2.66 | (3.62) | 3.45 | 3.12 | 3.09 |

(nH)

SEMICONDUCTOR DEVICE

CROSS-REFERENCE TO RELATED APPLICATIONS

The disclosure of Japanese Patent Application No. 2005-342479 filed on Nov. 28, 2005 including the specification, drawings and abstract is incorporated herein by reference in its entirety.

BACKGROUND OF THE INVENTION

1. Field of the Invention

The present invention relates to a semiconductor device that enables parallel operation of external output and external input, and particularly relates to a technique for reducing a noise caused by an undesired inductance component parasitizing a package substrate mounted with a semiconductor integrated circuit. For example, the invention relates to a technique effective for use in a quad static random access memory (quad SRAM) in which external data output operation timing can be varied with respect to input operation of external multi-bit data.

2. Description of Related Art

When current change occurs in a signal transfer system, noise voltage in proportion to self-inductance is produced, in addition, when current change occurs in an adjacent, and different signal transfer system, noise voltage is also produced in proportion to mutual inductance. When a wiring of an external data output system and a wiring of an external data input system are adjacent vertically or horizontally in a package substrate of a semiconductor substrate, if an external output condition is changed during external data input operation, current change in the output system induces noise voltage in the input system in accordance with the mutual inductance. Therefore, if input operation timing is specified such that the input timing is always in a period of determining output operation, input data are not significantly distorted by the output operation. Patent document 1 describes a technique of reducing a crosstalk noise due to mutual inductance in a semiconductor integrated circuit.

In a package structure using a full grid, ball grid array (BGA) having package terminals, a semiconductor integrated circuit having a WPP (wafer process package) structure having solder bump electrodes as outer terminals is mounted on a package substrate having BGA, the solder bump electrodes being to be connected to pad electrodes via leader wirings. Since connection between respective wiring layers needs be performed via through-holes in a multilayer wiring package substrate, the through-holes needs to be formed avoiding positions of BGA balls and solder bumps. Therefore, it is desirable that the BGA balls and the solder bumps are disposed such that they are overlapped in viewing in a stacking direction of the semiconductor integrated circuit and the package substrate in order to arrange the through-holes of the package substrate orderly or regularly. Patent document 2 describes a technique of disposing the balls and the bumps with being overlapped in such a way.

Patent document 1: JP-A-11-135668.

Patent document 2: JP-A-2001-203298.

The inventor has investigated reduction in mutual inductance between an external output signal system and an external input signal system, in which parallel operation is enabled, in a semiconductor device having a BGA package structure. When the through-holes formed in the package substrate is disposed orderly and regularly as described in the Patent document 2, the number of places where the through-holes are partially concentrated can be decreased, consequently the degree of freedom of wiring paths formed on the package substrate is increased, and the degree of freedom of spacing or shielding between the external output signal system and the external input signal system, in which parallel input/output operation is enabled, can be increased.

However, it is not enough to sufficiently reduce mutual inductance. The inventor had the following knowledge from investigation. First, when the semiconductor integrated circuit having the WPP structure is mounted on the BGA package substrate, a wiring layer as a top layer of the BGA package substrate is directly opposed to leader wirings connecting between the solder bumps and the pad electrodes, and a shield layer is not provided between them. When a wiring of an external output signal system and wiring of an external input signal system exist as wirings opposed in such a way, a noise are added to an external input signal. The inventor found that allocation of a major wiring to the top wiring layer of the package substrate is particularly important in this sense. That is, importance of function allocation to wiring layers of the semiconductor package substrate is increased. On the other hand, it was found that since leader wirings from the pad electrodes to the solder bumps in the WPP structure of the semiconductor integrated circuit was necessary to be in a planar layout, an inductance component was necessary to be effectively reduced in the planar layout in the leader wirings.

SUMMARY OF THE INVENTION

It is desirable to reduce or suppress induction of a noise from the external output signal system to the external input signal system, in which parallel input/output operation is enabled. In a word, it is desirable to reduce mutual inductance from the external output signal system to the external input signal system, in which parallel input/output operation is enabled.

The foregoing and other desirableness and novel features of an embodiment of the invention will be clarified from description of the specification and accompanied drawings.

Summaries of typical inventions in inventions disclosed in the application are briefly described as follows.

[1] <Allocation of Wiring Layer of Package Substrate>

A semiconductor device (1) has a package substrate (2) and a semiconductor integrated circuit (3) mounted on the package substrate. The semiconductor integrated circuit has a plurality of external connection terminals (BMP) facing the package substrate, and has an external input terminal (BMP [D]) and an external output terminal (BMP[Q]), in which parallel input/output operation is enabled, as part of the plurality of external connection terminals, an external ground terminal (BMP[Vss]), and an external power terminal (BMP [Vdd]). The package substrate has a plurality of module terminals (BLL) in an array layout on a surface opposite to a surface to be mounted with the semiconductor integrated circuit. The package substrate has a plurality of wiring layers (L1 to L4) on which wiring patterns necessary for electrically connecting between the external connection terminals and the module terminals corresponding to each other were formed. In the plurality of wiring layers, a first wiring layer (L1) facing the semiconductor integrated circuit has major wiring (L1[D]) for connecting between the external input terminal and the module terminal corresponding to each other, and a second wiring layer (L4) in which the module terminals are formed has a major wiring (L4[Q]) for connecting between the external output terminal and the module terminal corresponding to each other.

From the above, a major signal wiring of an external output system to be connected to the external output terminal is made to be in a wiring layer distant from the semiconductor integrated circuit (formed on a surface opposite to a surface to be mounted with the semiconductor integrated circuit), therefore induction of noise voltage, which is due to change in current of the major signal wiring of the external output system, can be reduced on a signal wiring of an external input system at a semiconductor integrated circuit side.

As a specific configuration of the embodiment of the invention, the package substrate has a third wiring layer (L3), in which a planar conductor pattern (PLN[Vss]) to be connected to the external ground terminal is mainly formed, between the first wiring layer and the second wiring layer. The conductor pattern of the third wiring layer shields a magnetic field produced by current change on the major signal wiring of the external output system. Thus, noise resistance is further improved in input operation parallel to output operation.

As another specific configuration of the embodiment of the invention, the semiconductor integrated circuit has a semiconductor chip (10) and a plurality of leader wirings (BLN), and the leader wirings act to couple pad electrodes (CPD) exposed from a surface protection film of the semiconductor chip with the external connection terminals corresponding to the pad electrodes. In a word, the semiconductor integrated circuit employs a so-called WPP structure. In the so-called WPP structure, various leader wirings face a top layer of the package substrate, and a shield layer is not provided between them. Accordingly, in the so-called WPP structure, the above configuration has high effective noise resistance, in which the major signal wiring of the external output system to be connected to the external output terminal is made to be in the wiring layer distant from the semiconductor integrated circuit.

As further specific configuration, the leader wiring to be connected to the external input terminal in the semiconductor integrated circuit is in an orthogonal layout to a wiring of the first wiring layer to be connected to the external output terminal of the semiconductor integrated circuit. Mutual inductance between the orthogonal conductors can be substantially neglected.

As still another specific configuration of the embodiment of the invention, the semiconductor integrated circuit further has a first external clock input terminal (BMP[C, /C]) and a second external clock input terminal (BMP[K, /K]) as the external connection terminals. The first external clock input terminal is inputted with a clock signal for synchronizing output operation of data outputted from the external output terminal. The second external clock input terminal is inputted with a clock signal for synchronizing input operation of data inputted from the external input terminal. In a configuration where external output operation timing is varied with respect to external input operation, since a measure for a noise can not be taken by controlling timing of input or output operation, a measure for a noise by function allocation to the wiring layers of the package substrate is essential.

As a further specific configuration, in the leader wirings, a first leader wiring for clock (BLN[C, /C]) to be connected to the first external input terminal and a second leader wiring for clock (BLN[K, /K]) to be connected to the second external input terminal are connected to corresponding pad electrodes (CPD[C, /C], CPD[K, /K]) across a central portion of the semiconductor chip. Typically, the pad electrodes for clock input are often disposed in a central portion of the semiconductor integrated circuit in the light of a measure for clock skew. In consideration of this, a clock supply wiring is allowed to pass through the center in an upper wiring layer of the package substrate, so that an external clock input terminal such as a solder ball can be connected to the relevant clock supply wiring. If this is carried out, a through-hole can not be formed in the central portion. On the contrary, when the leader wiring to be connected to the pad electrode for clock input is formed in the central portion of the semiconductor integrated circuit as described above, and the external clock input terminal such as solder ball is formed on the leader wiring, the clock wiring need not be formed in the center of the package substrate. This improves the degree of freedom of layout of through-holes formed in the package substrate, consequently the degree of freedom of wiring layout on the package substrate can be helped to be improved.

As a further specific configuration, for example, the package substrate has a plurality of through-holes (TH[Vss]) for connecting between wirings of different wiring layers at positions where the wirings are overlapped with the first leader wiring for clock and the second leader wiring for clock.

As a further specific configuration, with respect to a pitch of an array layout of the module terminals, the external connection terminals have a pitch half the relevant pitch as a basic pitch, and module terminals and external connection terminals, which are arranged in an equal pitch to each other, are overlapped in a direction of two sides of the package substrate and the semiconductor integrated circuit. Thus, the through-holes formed in the package substrate are easily arranged orderly and regularly. Again in this regard, the number of places where the through-holes are partially concentrated can be decreased, consequently the degree of freedom of wiring paths formed on the package substrate is increased, and the degree of freedom of spacing or shielding between the external output signal system and the external input signal system, in which parallel input/output operation is enabled, can be increased.

[2] <WPP Bump Arrangement>

A semiconductor device (1) according to another viewpoint of the embodiment of the invention has a package substrate (2) and a semiconductor integrated circuit (3) mounted on the package substrate. The semiconductor integrated circuit has a semiconductor chip (10), a plurality of leader wirings (BLN), and a plurality of external connection terminals (BMP) facing the package substrate. The leader wirings act to couple pad electrodes (CPD) exposed from a surface protection film of the semiconductor chip with corresponding external connection terminals (BMP), and the so-called WPP structure is employed for the semiconductor integrated circuit. The semiconductor integrated circuit has an external input terminal (BMP[D]) and an external output terminal (BMP[Q]), in which parallel input/output operation is enabled, an external ground terminal (BMP[Vss]), an external power terminal (BMP[Vdd]), and an external input/output power terminal (BMP[Vddq]), as part of the plurality of external connection terminals. The external input/output power terminal is for supplying operation power to a circuit to be connected to the external output terminal and the external input terminal. A first array of the pad electrodes, a second array of the external input/output power terminal and the external ground terminal, a third array of the external output terminal, a fourth array of the external input/output power terminal and the external ground terminal, and a fifth array of the external input terminal are sequentially formed in an area from a central portion to an edge portion of the semiconductor integrated circuit.

From the above, since the external ground terminal or the external input/output power terminal is always disposed between the first array of the pad electrodes, the third array of the external output terminal, and the fifth array of the external input terminal, a leader wiring to be connected to the external ground terminal or a leader wiring to be connected to the external input/output power terminal is easily disposed between a leader wiring for the external input terminal and a leader wiring for the external output terminal adjacent to each other. The leader wiring to be connected to the external ground terminal and the leader wiring to be connected to the external input/output power terminal act as an electromagnetic shield wiring for the leader wiring for the external input terminal and the leader wiring for the external output terminal adjacent to each other, consequently crosstalk between a leader wiring for external output and a leader wiring for external input can be suppressed.

Furthermore, when the leader wiring for external output and the leader wiring for external input are disposed such that they are adjacent to a leader wiring for external input/output power or ground power, electromagnetically tight coupling between a signal path and a return path thereof is easily made, consequently effective inductance of a signal system is easily reduced.

Furthermore, since the external output terminal is disposed near the first array of the pad electrodes compared with the external input terminal, an output leader wiring that may be a noise source can be shortened. Again in this regard, noise resistance is improved.

As a specific configuration of the embodiment of the invention, a sixth array of the external ground terminal and the external power terminal are formed at a side opposite to a side of the second array of the external input/output power terminal and the external ground terminal across the first array of the pad electrodes. Since the array of the pad electrodes exists next to the array of the external ground terminal and the external power terminal, the leader wiring for the external ground terminal is easily made adjacent to the leader wiring for the external power terminal. In a word, electromagnetically tight coupling between a power and a return path thereof is easily made, consequently effective inductance of a power system can be reduced.

As another specific configuration of the embodiment of the invention, the leader wiring (BLN[D]) to be connected to the external input terminal in the semiconductor integrated circuit is in an orthogonal layout to a wiring of the first wiring layer (L1) to be connected to the external output terminal of the semiconductor integrated circuit. Mutual inductance is eliminated in principle by the orthogonal layout, consequently crosstalk between an external output system signal wiring of the package substrate and an external input system leader wiring of the semiconductor integrated circuit can be suppressed.

As still another specific configuration of the embodiment of the invention, the package substrate has a plurality of module terminals (BLL) in an array layout on a surface opposite to a surface to be mounted with the semiconductor integrated circuit. The package substrate has a plurality of wiring layers having a wiring pattern formed thereon, the wiring pattern being necessary for electrically connecting between the external connection terminals and corresponding module terminals. In the plurality of wiring layers, a first wiring layer (L1) has a major wiring for connecting between the external input terminal and a corresponding module terminal, and a second wiring layer (L4) in which the module terminals are formed has a major wiring for connecting between the external output terminal and a corresponding module terminal. From the above, since a major signal wiring of the external output system to be connected to the external output terminal is made to be in a wiring layer distant from the semiconductor integrated circuit, noise voltage can be reduced to be induced in the signal wirings of the external input system at a semiconductor integrated circuit side due to current change in the major signal wiring of the external output system.

As a further specific configuration, the package substrate has a third wiring layer (L3) in which a planar conductor pattern (PLN[Vss]) to be connected to the external ground terminal is mainly formed, and a fourth wiring layer (L2) in which a planar conductor pattern (PLN[Vddq]) to be connected to the external input/output power terminal is mainly formed, between the first wiring layer and the second wiring layer. The conductor patterns of the third and fourth wiring layers act as a shield layer against a magnetic field produced by current change on the major signal wiring of the external output system.

As a further specific configuration, the second wiring layer (L4) further has a planar conductor pattern (PLN[Vdd]) to be connected to the external power terminal. The third wiring layer is disposed between the second wiring layer (L4) and the fourth wiring layer (L2). The planar conductor pattern to be connected to the external input/output power terminal and the planar conductor pattern to be connected to the external power terminal are separated in the fourth wiring layer (L2) and the second wiring layer via the third wiring layer (L3), therefore inductance of each power system of the external input/output power and the external power is reduced. Furthermore, the planar conductor pattern of the fourth wiring layer to be connected to the external input/output power terminal configures a return path of the major input signal wiring formed in the first wiring layer, and the planar conductor pattern of the third wiring layer (L3) to be connected to the ground terminal configures a return path of the major output signal wiring formed in the fourth wiring layer, therefore effective inductance of a data output system and a data input system of each wiring layer can be helped to be reduced.

Further description is made with regard to allocation of wiring layers. The embodiment of the invention uses the semiconductor integrated circuit (3) that enables parallel operation of external input and external output of data. External output tends to produce a noise due to current change on a signal wiring. Therefore, when a major signal wiring of an external input system is disposed near a major signal wiring of an external output system, noise voltage is induced in the signal wiring of the external input system in the semiconductor integrated circuit due to current change on the major signal wiring of the external output system, resulting in malfunction. Thus, the major signal wiring of the external input system is disposed on a main surface (side at which the semiconductor integrated circuit is mounted) of the package substrate as the first wiring layer (L1), and the major signal wiring of the external output system is disposed on a back surface (side at which the module terminals are formed) opposite to the main surface of the package substrate as the second wiring layer (L4), and furthermore the third wiring layer (L3) in which the planar conductor pattern (PLN[Vss]) to be connected to the external ground terminal is mainly formed, and the fourth wiring layer (L2) in which the planar conductor pattern (PLN[Vddq]) to be connected to the external input/output power terminal is mainly formed are disposed between the first wiring layer (L1) and the second wiring layer (L4), so that the third and fourth wiring layers are allowed to work as a shield layer, consequently the measure for noise can be taken.

Here, the reason for forming the conductor layers in the package substrate in a planar shape, the conductor layers being to be connected to the external ground terminal, the external input/output power terminal and the external power terminal, is to reduce effective inductance, since electric potential is high. At that time, the conductor layers formed in the planar shape respectively are preferably formed in the third wiring layer (L3) and the fourth wiring layer (L4) as internal layers of the package substrate. The reason for this is considered as follows: since a plurality of external connection electrodes, a plurality of module terminals, wiring patterns or through-holes are formed on the main surface (L1) and the back surface (L4) of the package substrate, a large pattern in the planar shape is hardly formed thereon. From such a reason, the conductor layers in the package substrate to be connected to the external ground terminal, the external input/output power terminal and the external power terminal are preferably formed in the third wiring layer (L3) and the fourth wiring layer (L4) as internal layers. Among them, since the planar conductor pattern (PLN[Vss]) to be connected to the external ground terminal, the pattern being mainly formed in the third wiring layer (L3), is at the reference potential, sufficiently large area is desirably secured for the conductor pattern to obtain stable electric operation of the semiconductor integrated circuit, therefore the conductor pattern is preferably disposed in a wiring layer different from those for the conductor layers in the package substrate to be connected to the external input/output power terminal and the external power terminal. Moreover, while both of the conductor patterns to be connected to the external input/output power terminal and the external power terminal are essentially wirings for power, they supply power to different objects, and serve different potential. Furthermore, since the conductor pattern to be connected to the external input/output power terminal serves the highest potential in the package substrate, it is even a noise source, a wiring layer for the conductor pattern is considered to be preferably spaced from a wiring layer for the conductor pattern to be connected to the external power terminal. Here, when the third wiring layer (L3) is disposed between the conductor pattern in the package substrate to be connected with the external input/output power terminal and the conductor pattern in the package substrate to be connected to the external power terminal, the shield effect is obtained as described before, therefore the measure for noise can be taken. However, since the major wiring pattern to be connected to the external output terminal (BMP[Q]) in the second wiring layer also tends to produce a noise as described before, the conductor pattern to be connected to the external ground terminal is preferably disposed near the second wiring layer and in the third layer (L3) from the main surface as the first layer (L1) of the package substrate. In addition, when a planar conductor pattern to be connected to the external input/output power terminal at relatively high potential is formed in the fourth wiring layer between the first wiring layer and the third wiring layer, effective inductance can be also reduced. In consideration of these, the planar conductor pattern (PLN[Vdd]) to be connected to the external power terminal (BMP[Vdd]) is disposed in the same wiring layer (L4) as the second wiring layer, thereby the conductor pattern (PLN[Vdd]) can be hardly affected by a noise from the planar conductor pattern (PLN[Vddq]) in the fourth wiring layer (L2).

As still another specific configuration of the embodiment of the invention, the semiconductor integrated circuit further has a first external clock input terminal to be inputted with a clock signal for synchronizing output operation of data outputted from the external output terminal, and a second external clock input terminal to be inputted with a clock signal for synchronizing input operation of data inputted from the external input terminal. The semiconductor integrated circuit can be operated as a static random access memory. In a configuration where external output operation timing is varied with respect to external input operation, since the measure for noise can not be taken by controlling timing of input or output operation, the measure for noise by arranging the external connection terminals for each function in the semiconductor integrated circuit is essential.

Advantages obtained by typical inventions in the inventions disclosed in the application are briefly described as follows.

That is, induction of a noise from the external output signal system to the external input signal system, in which parallel input/output operation is enabled, can be reduced or suppressed. In addition, mutual inductance from the external output signal system to the external input signal system, in which parallel input/output operation is enabled, can be reduced.

BRIEF DESCRIPTION OF THE DRAWINGS

FIG. 4 shows a plan view illustrating a layout of pad electrodes CPD of the QDR-SRAM;

FIG. 5 shows a plan view illustrating a layout of bump electrodes BMP of the QDR-SRAM;

FIG. 6 shows a plan view illustrating a layout of ball electrodes BLL of the QDR-SRAM;

FIG. 23 shows an explanatory view showing an effective mutual inductance matrix obtained at points where evaluation is made on influence of change in output in data parallel input/output of QDR-SRAM upon input data;

FIG. 24 shows an explanatory view showing an effective mutual inductance matrix in the case of QDR-SRAM that did not use a WPP structure and a characteristic structure of the package substrate, as a comparative example;

FIG. 29 shows an explanatory view clearly showing a fact that input pins D18, D27 are large in mutual inductance with the nearest output pins Q18, Q27;

DESCRIPTION OF THE PREFERRED EMBODIMENT

<QDR-SRAM>

Figure 2:
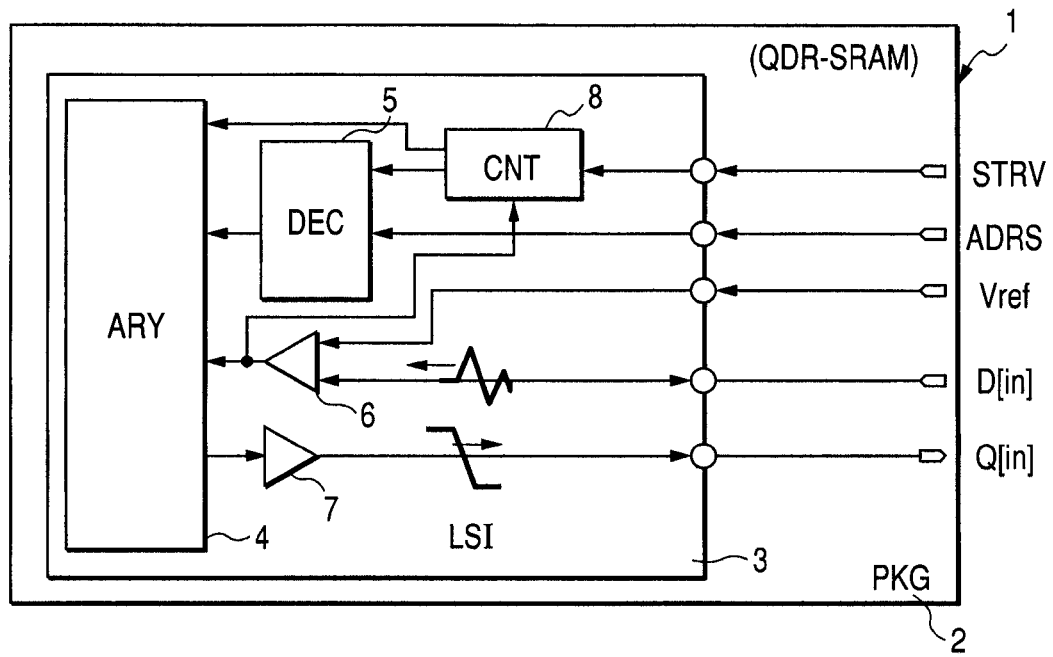
FIG. 2 shows a block diagram of the QDR-SRAM.

FIG. 2 shows a block diagram of a quad-static random access memory (QDR-SRAM) as an example of a semiconductor device according to an embodiment of the invention. QDR-SRAM 1 is configured by mounting a semiconductor integrated circuit (LSI) 3 having a WPP structure on a package substrate (PKG) 2 in a full grid, ball grid array (BGA) configuration. In the semiconductor integrated circuit 3, external input and external output of data are enabled in parallel, input and output are synchronized with a specific clock signal respectively, and each operation can be synchronized with a falling edge and a rising edge of a clock signal. Typically, D[in] indicates external input data, Q[out] indicates external output data, Vre indicates reference potential, ADRS indicates an address signal, and STRV indicates an external access control signal. A memory array (ARY) 4 has a plurality of memory banks each of which can independently perform memory operation, and selection of a memory cell is enabled for each memory bank, while not particularly limited. Selection of the memory cell is carried out according to a decoding result of an address signal ADRS by an address decoder (DEC) 5. An input circuit 6 performs external input of writing data into a selected memory bank for writing operation, and an output circuit 7 performs external output of reading data outputted from a selected memory bank for reading operation. The input circuit 6 is also used for command input into a control circuit 8. The control circuit 8 controls internal operation according to an input command and an access control signal, and synchronizes operation timing of the operation with an external clock signal.

Figure 3:
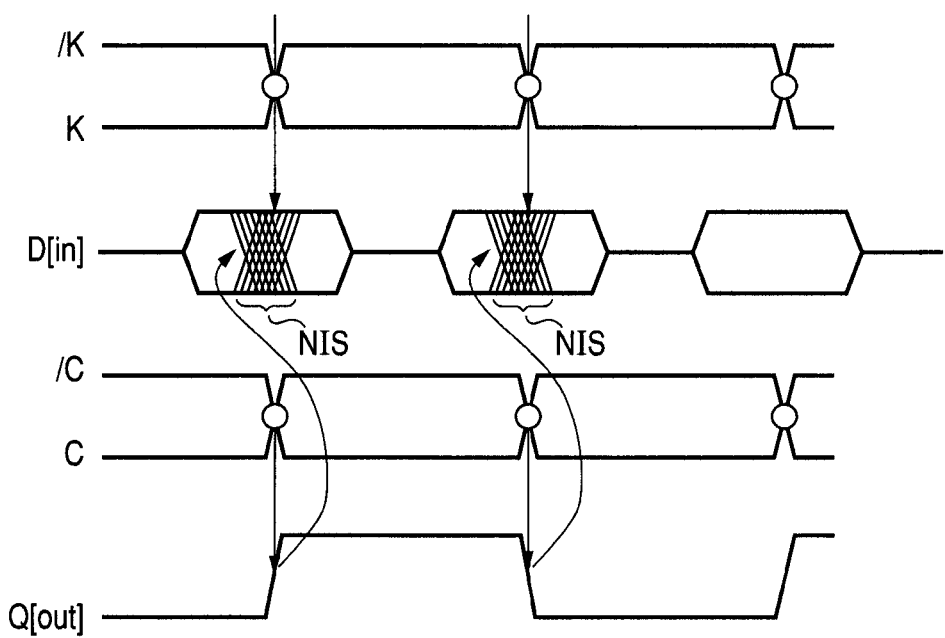
FIG. 3 shows a timing chart illustrating input and output operation timing of the QDR-SRAM.

FIG. 3 illustrates input/output operation timing. Data input by the input circuit 6 is synchronized with both clock edges of differential clock signals K, /K. Data output operation by the output circuit 7 is synchronized with both clock edges of differential clock signals C, /C. Phases of the clock signals K, /K and the clock signals C, /C may be the same or different. In a word, when input and output operations of data are performed in parallel, data input timing is made variable with respect to data output timing. When mutual inductance of an input signal wiring of input data to an output signal wiring of output data is assumed to be large, a noise is induced on the input signal wiring due to so-called crosstalk in accordance with change in current of an output signal wiring. Consequently, a logic value of input data D[in] is undesirably changed as shown in a portion of NIS in FIG. 3. In the QDR-SRAM 1 according to the embodiment, a measure as described later is taken such that the mutual inductance of the input signal wiring of input data to the output signal wiring of output data is reduced.

Figure 1:
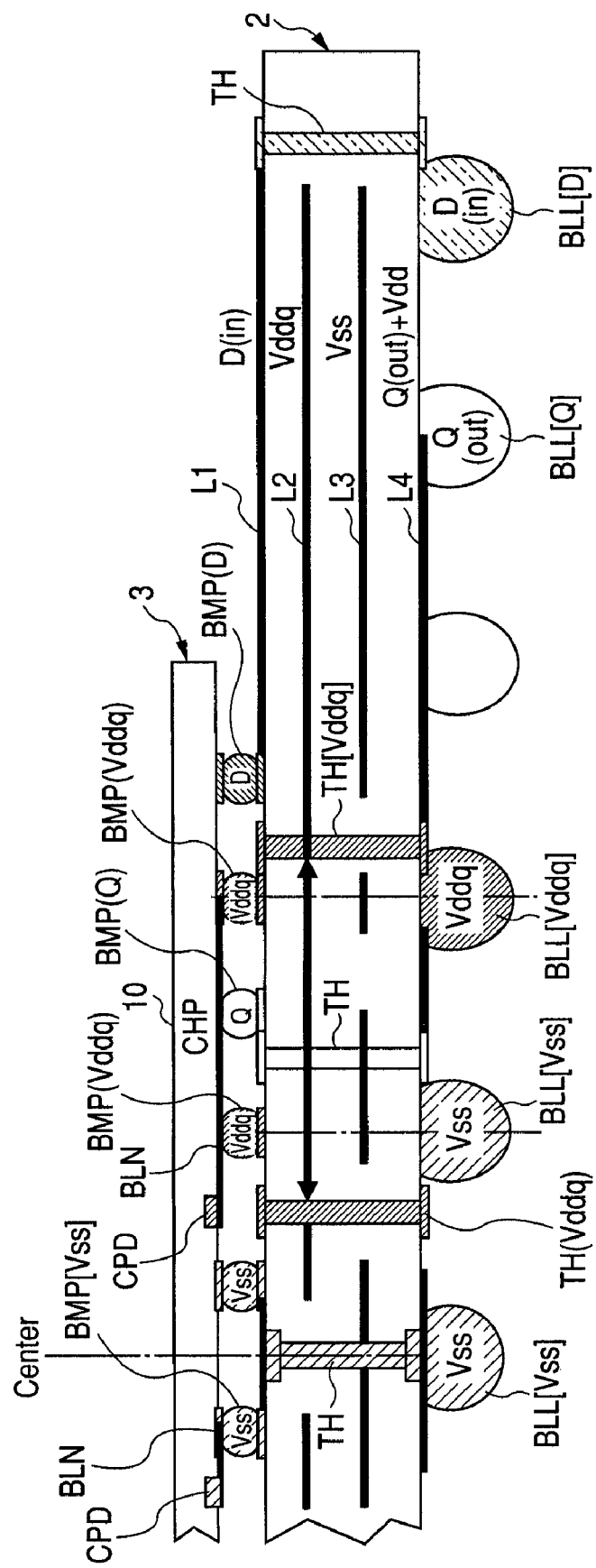
FIG. 1 shows a cross section view schematically showing a vertical section structure of QDR-SRAM according to an example of the invention.

FIG. 1 shows an outline of a vertical section structure of the QDR-SRAM 1. The WPP structure of the semiconductor integrated circuit 3 is configured by coupling pad electrodes CPD exposed from a surface protection film of a semiconductor chip (CHP) 10 with corresponding external connection terminals BMP by leader wirings (sometimes called WPP leader wirings, or rerouting wirings) BLN. The pad electrodes CPD are surface electrodes of the semiconductor chip 10 formed of aluminum and the like. The external connection terminals BMP are bump electrodes of solder, gold or the like, and formed by evaporation and the like in a semiconductor wafer state. The leader wirings BLN are, for example, cupper wirings. The pad electrodes CPD are disposed in a central portion of the semiconductor chip 10 in two lines along an edge of the chip. FIG. 4 illustrates a layout of the pad electrodes CPD. FIG. 5 illustrates a layout of the bump electrodes BMP.

A package substrate (PKG) 2 is formed of a multilayer wiring substrate having, for example, four wiring layers of L1 to L4. Wiring patterns of the wiring layers are formed of aluminum and the like, and respective wiring layers are insulated by glass epoxy resin disposed between them. Wiring patterns of the respective wiring layers are connected to one another via the through-holes TH. The bump electrodes BMP are connected to a wiring pattern of the wiring layer L1. Ball electrodes BLL as many module terminals are in an array layout on the wiring layer L4. The ball electrodes BLL are formed of solder and the like. FIG. 6 illustrates a layout of the ball electrodes BLL. In FIGS. 4 to 6, references are marked, including VDD for power, VSS for ground, VDDQ for external input/output power, Di for data input, Qi for data output, SA for address, C, /C for output clock, K, /K for input clock, and /BW, /R and /W for control system.

Figure 7:
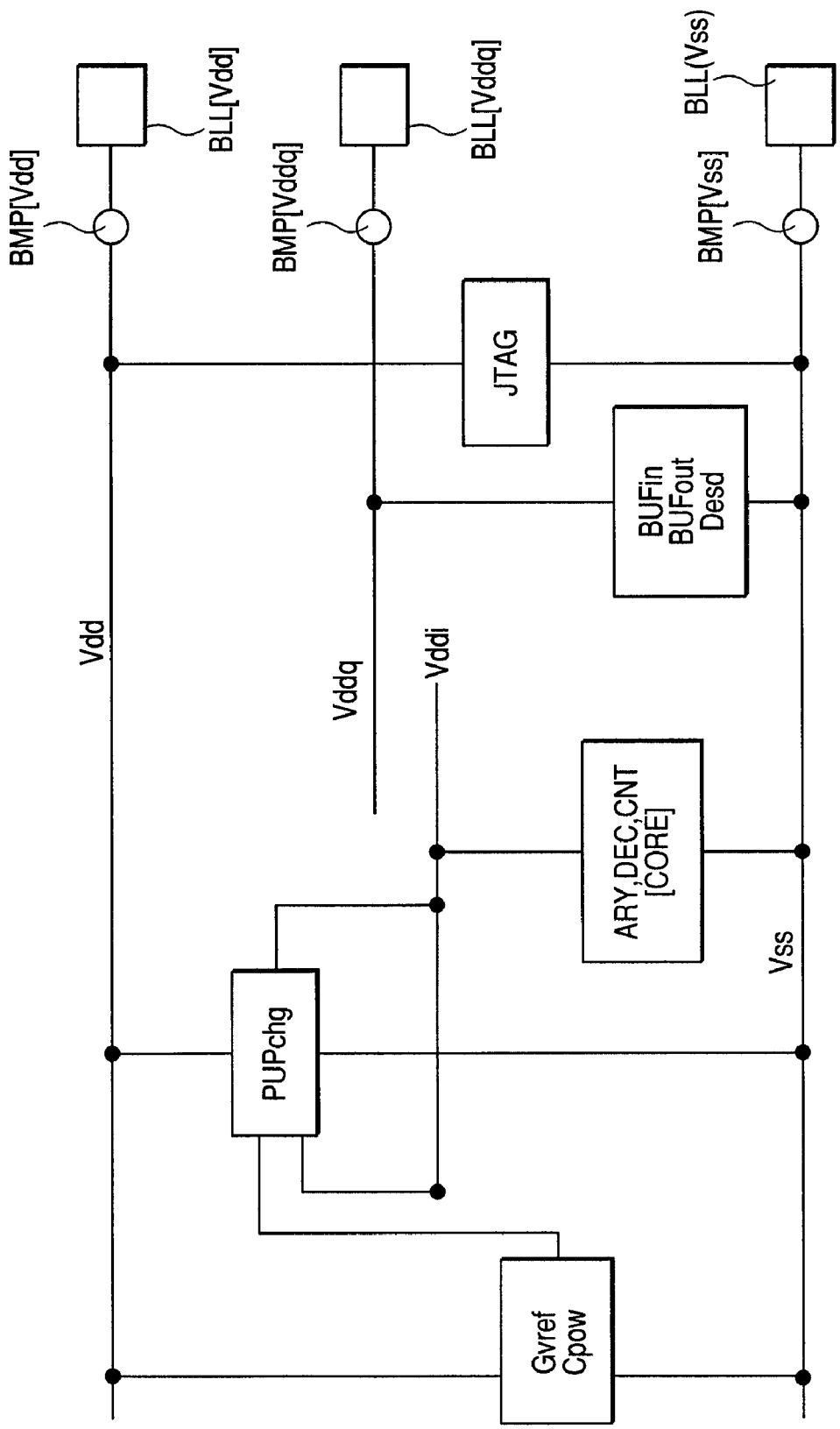
FIG. 7 shows a block diagram illustrating an outline of a power system of the QDR-SRAM.

FIG. 7 illustrates an outline of a power system of the QDR-SRAM 1. Vdd is power voltage supplied from the outside, Vddq is power voltage for input/output circuit supplied from the outside, Vddi is internal stepdown voltage, and Vss is ground voltage. The power voltage Vdd is used for operation power of a stepdown circuit (PUPchg), reference voltage generation circuit (Gvref), power control circuit (Cpow), and boundary scan test circuit according to JTAG (Joint European Test Action Group). The internal stepdown voltage Vddi is produced in the stepdown circuit (PUPchg), and used for operation power of core circuits (CORE) of SRAM such as a memory array (ARY) 4, decoder (DEC) 5 and control circuit (CONT) 8. The power voltage for input/output circuit Vddq is used for operation power of an input circuit (BUFin) 6, an output circuit (BUFout) 7 and an input protection diode (Desd) and the like. The power voltage Vdd is supplied through power ball electrodes BLL [Vdd] and power bump electrodes BMP [Vdd]. The power voltage for input/output circuit Vddq is supplied through power ball electrodes BLL [Vddq] and power bump electrodes BMP [Vddq] The ground voltage Vss is supplied through ground ball electrodes BLL [Vss] and ground bump electrodes BMP [Vss].

Figure 8:
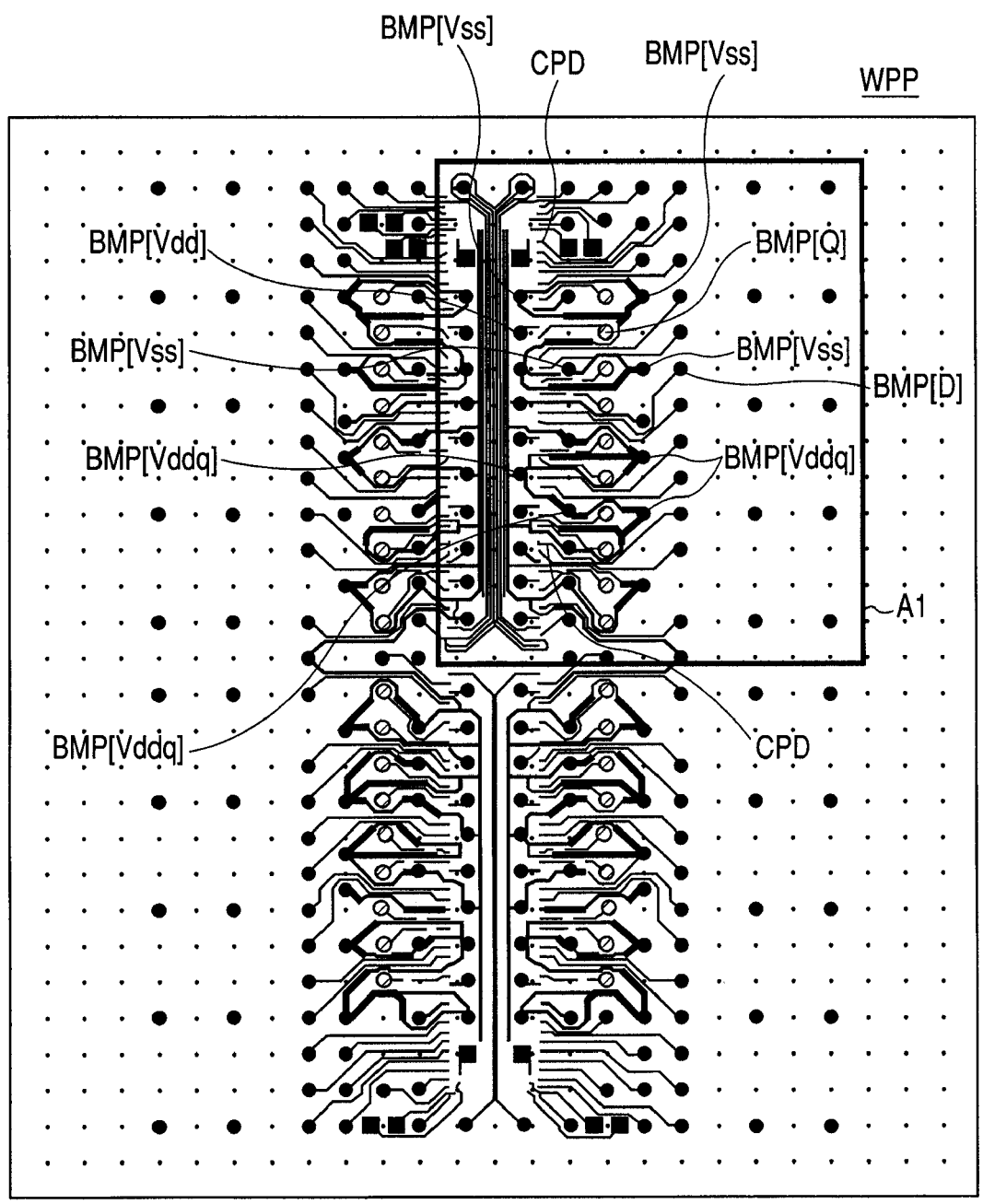
FIG. 8 shows a plan view showing a WPP structure of a semiconductor integrated circuit.
Figure 9:
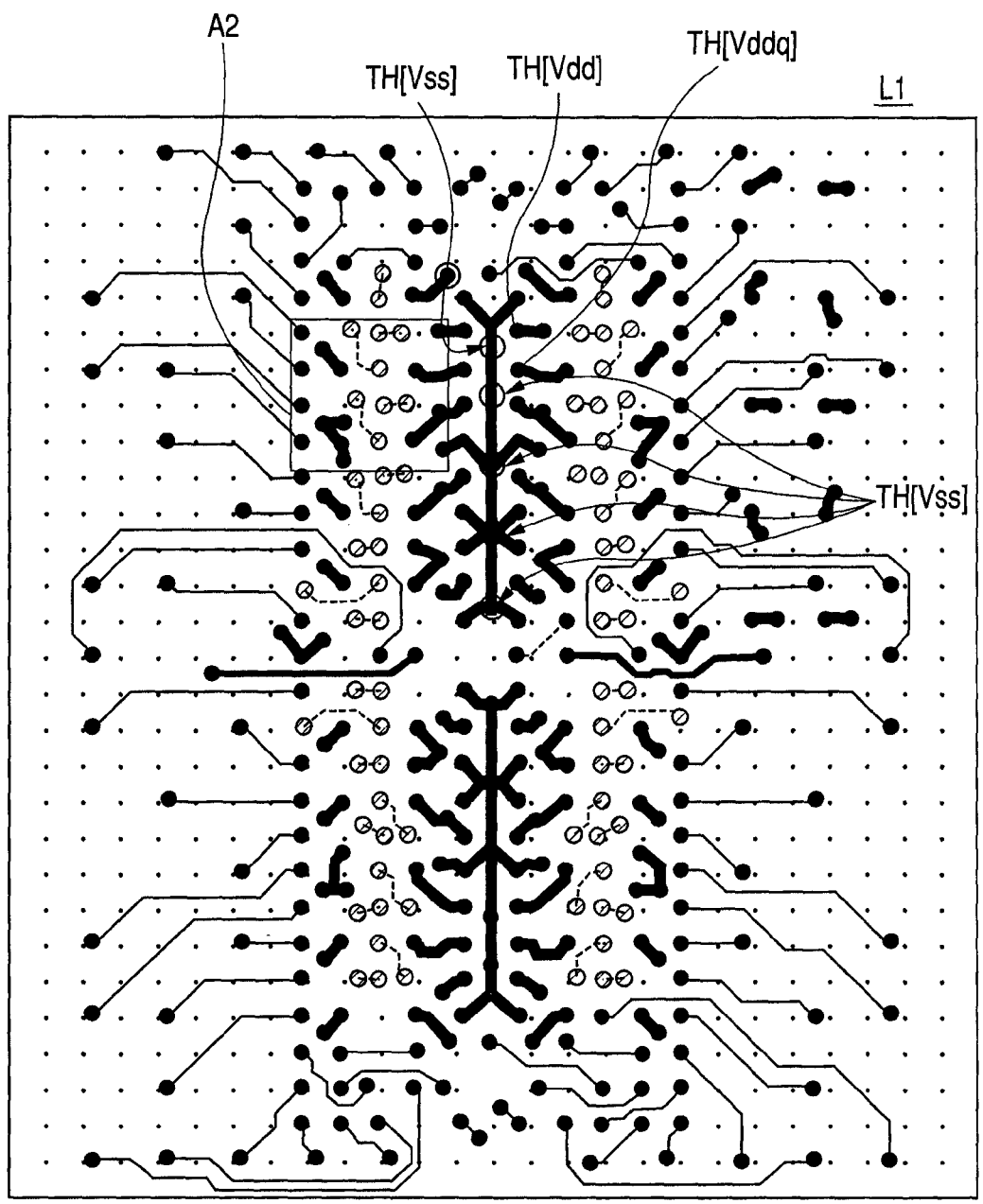
FIG. 9 shows a plan view showing a planar configuration of a wiring layer L1 of a package substrate.
Figure 10:
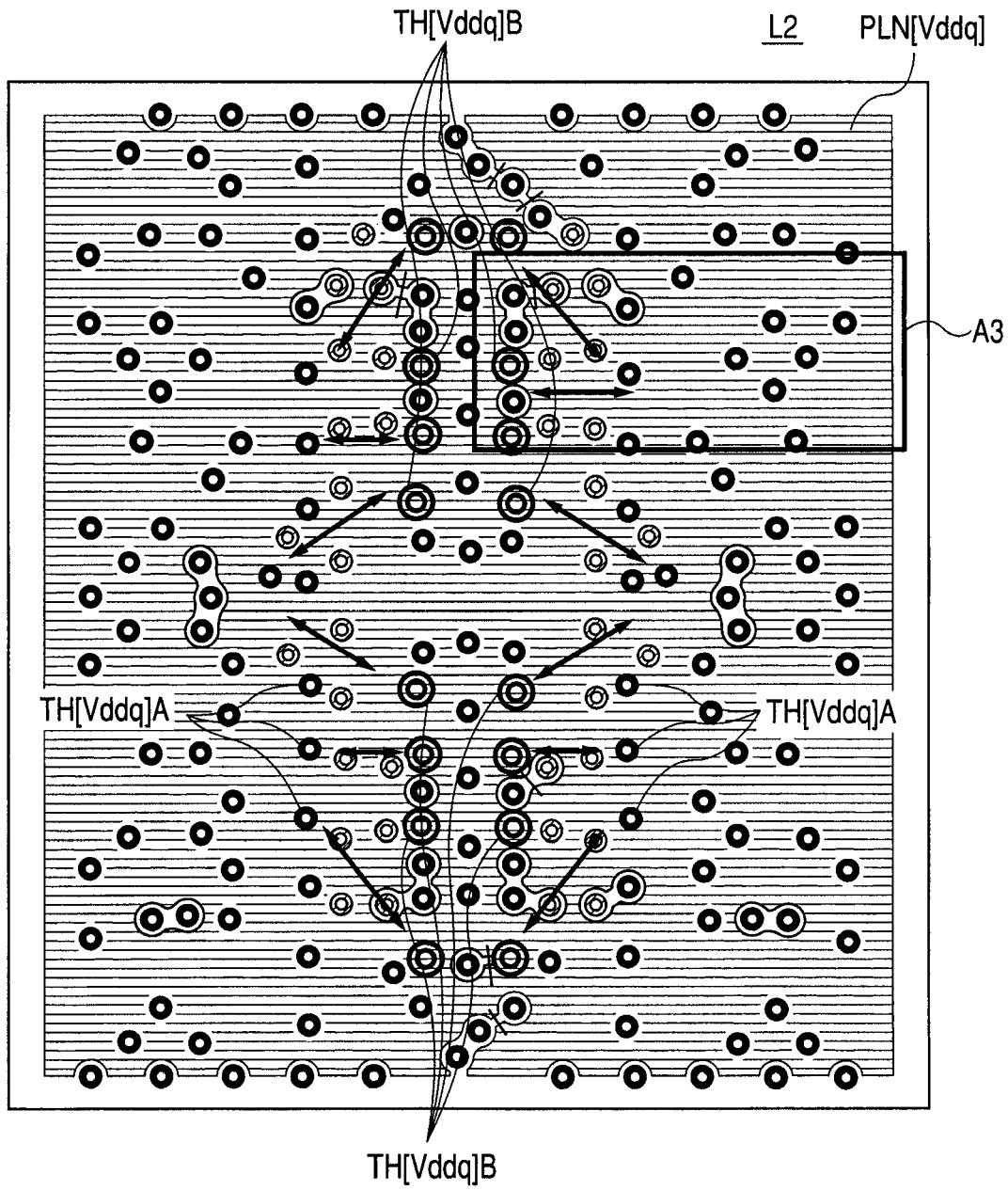
FIG. 10 shows a plan view showing a planar configuration of a wiring layer L2 of the package substrate.
Figure 11:
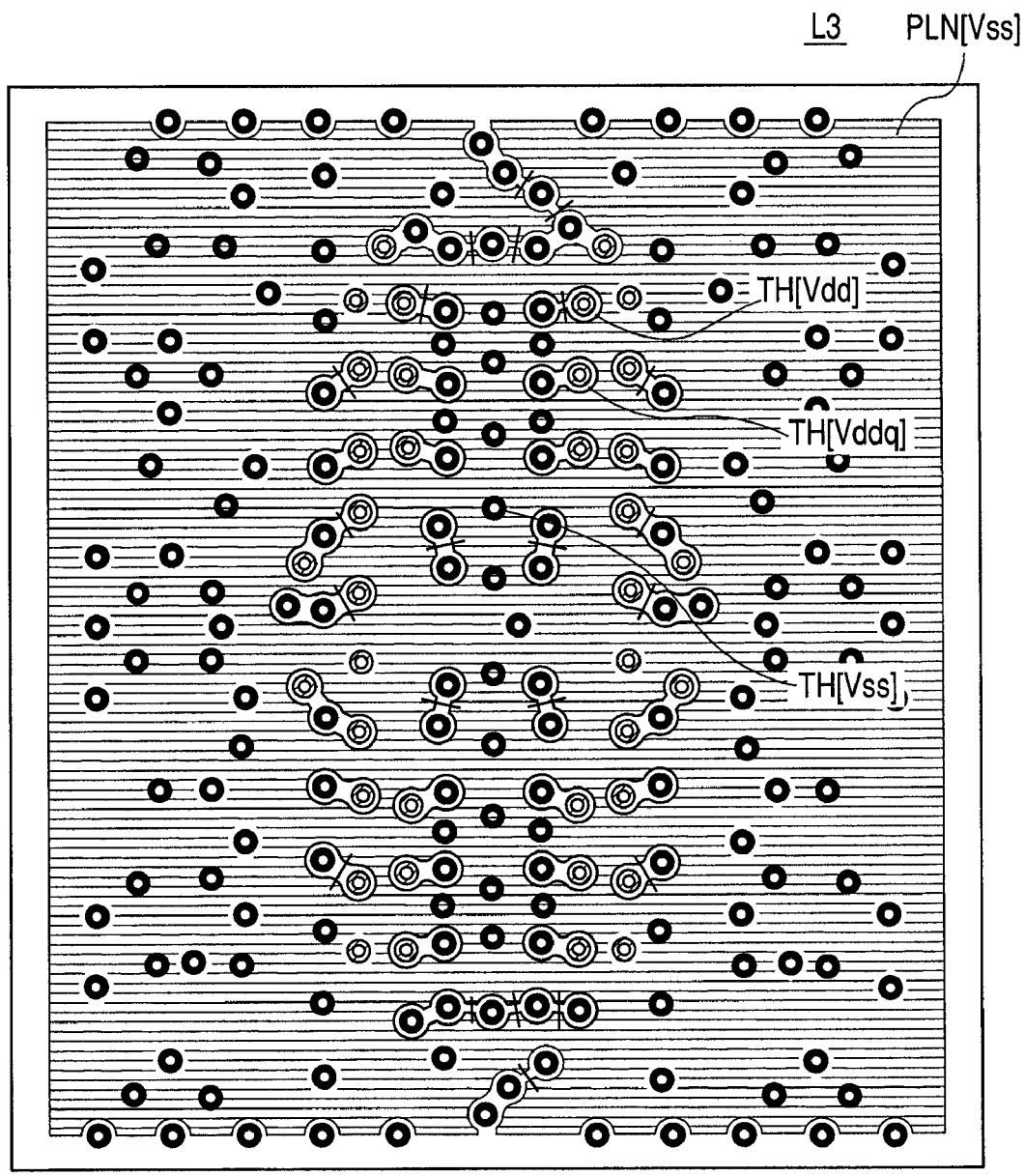
FIG. 11 shows a plan view showing a planar configuration of a wiring layer L3 of the package substrate.
Figure 12:
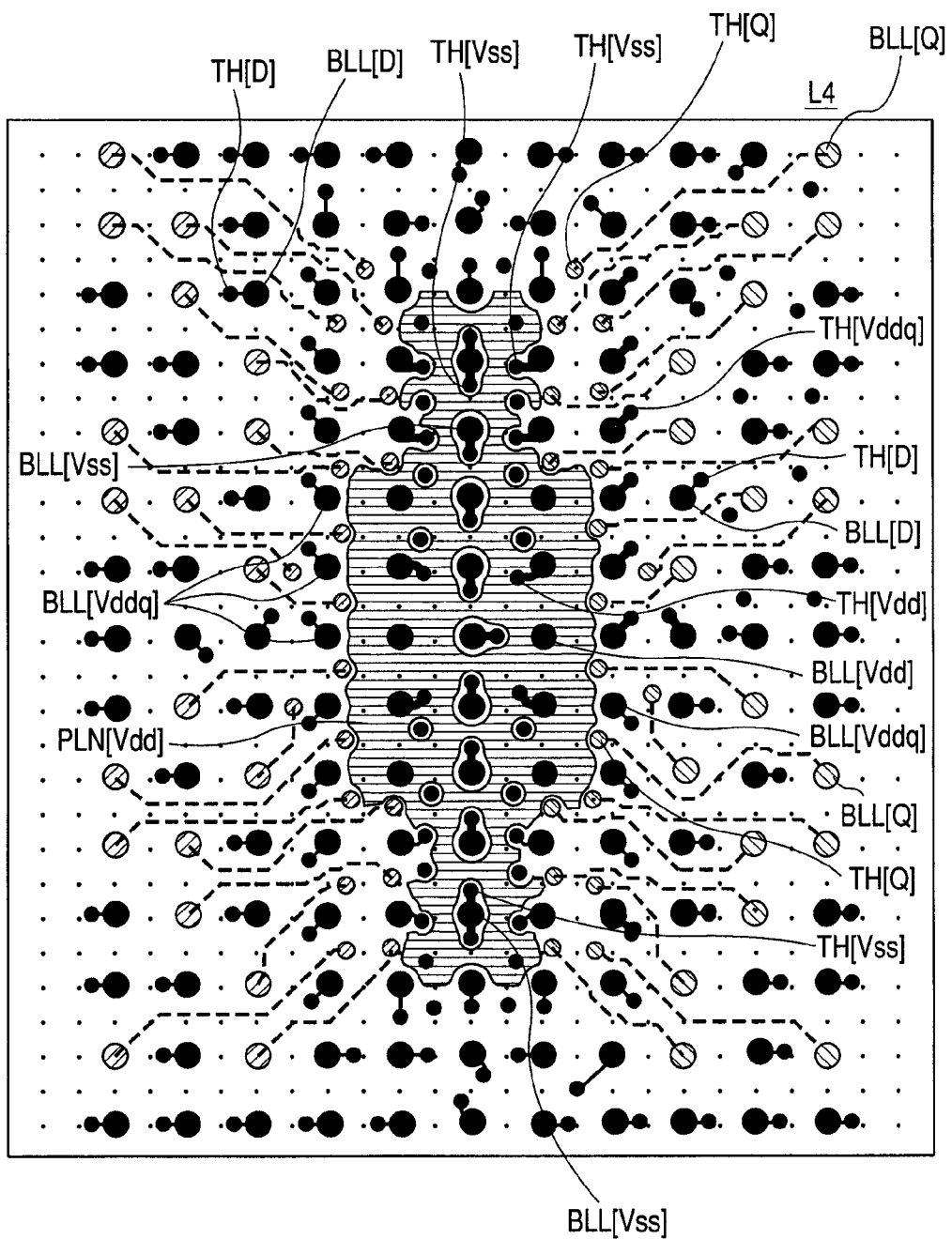
FIG. 12 shows a plan view showing a planar configuration of a wiring layer L4 of the package substrate.
Figure 13:
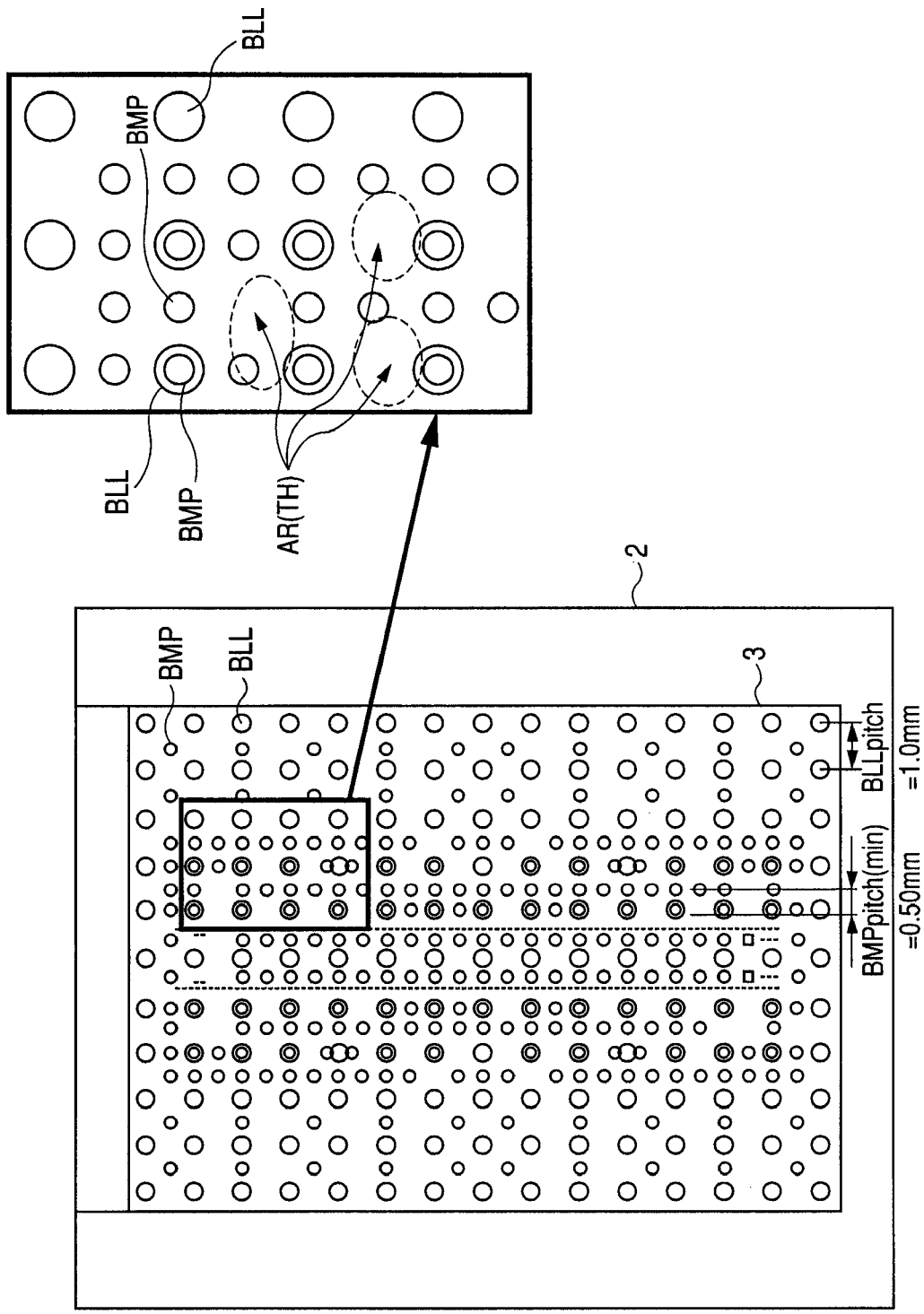
FIG. 13 shows a plan view showing a planar, relative positional relationship between the bump electrodes BMP and the ball electrodes BLL.

FIG. 8 shows a planar configuration of the WPP structure. FIG. 9 shows a planar configuration of a wiring layer L1, FIG. 10 shows a planar configuration of a wiring layer L2, FIG. 11 shows a planar configuration of a wiring layer L3, and FIG. 12 shows a planar configuration of a wiring layer L4. FIG. 13 shows a planar, relative positional relationship between the bump electrodes BMP and ball electrodes BLL. In FIG. 13, BMPpitch (min) means a minimum bump pitch, and BLLpitch means a ball pitch. Hereinafter, the WPP structure in the semiconductor integrated circuit and a characteristic configuration of the package substrate are described.

<Allocation of Wiring Layers of Data Input/Output System>

Figure 14:
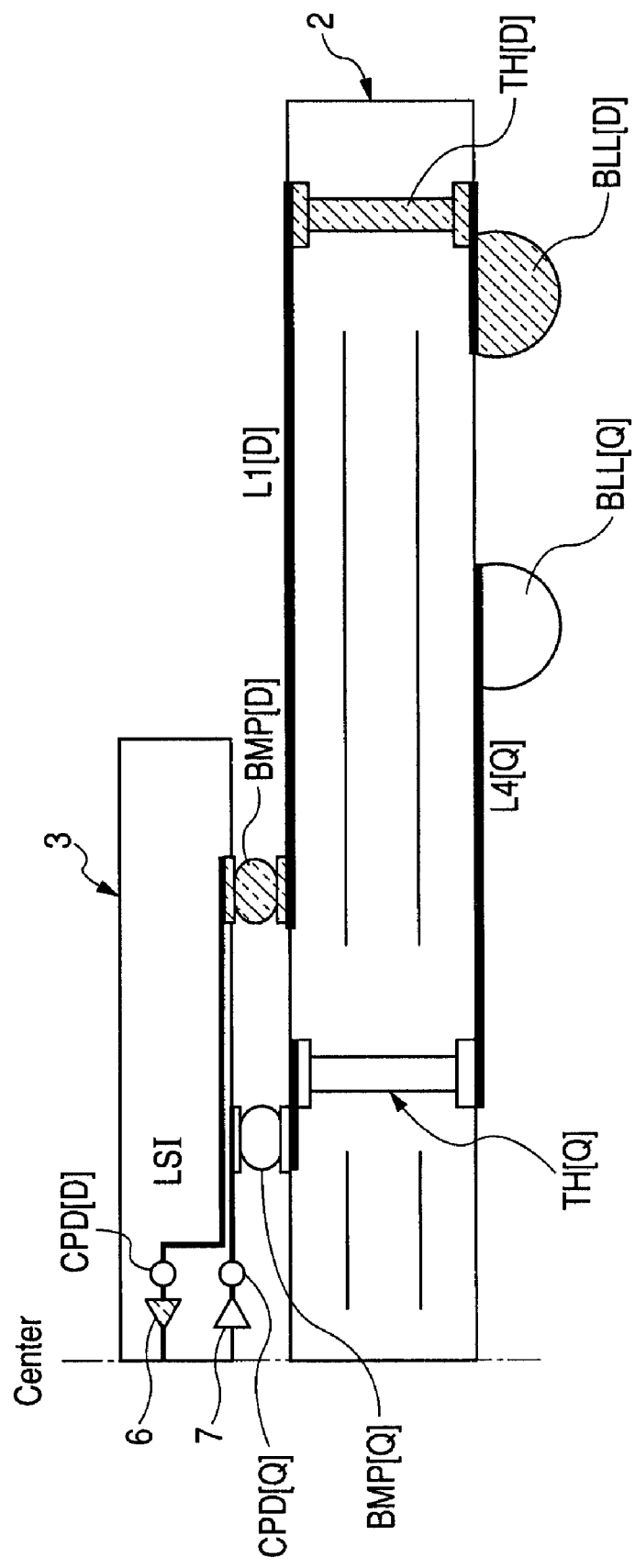
FIG. 14 shows a vertical section view showing allocation of wiring layers of a data input/output system.

As directly shown in vertical section structures of FIG. 1 and FIG. 14, major wirings connecting between data input bump electrodes BMP[D] and corresponding data input ball electrodes BLL[D] are formed in the wiring layer L1 on a surface, and major wirings connecting between data output bump electrodes BMP[Q] and corresponding data output ball electrodes BLL[Q] are formed in the wiring layer L4 on a back. The wiring layer for data input system wirings are spaced from the wiring layer for data output system wirings, thereby crosstalk between them can be reduced. The pad electrodes CPD of the semiconductor integrated circuit 3 are disposed in a central portion of the semiconductor chip 10, and the data output bump electrodes BMP[Q] are disposed near the pad electrodes CPD compared with data input bump electrodes BMP[D]. In a word, through-holes TH[Q] to be connected to the data output bump electrodes BMP[Q] are disposed near the center of the package substrate 2 compared with through-holes TH[D] to be connected to the data input bump electrodes BMP[D]. Consequently, output signal wirings that may be a noise source are made to be near data output pad electrodes CPD[Q], and in the distant wiring layer L4. As a result, length of the output signal wirings that may be the noise source on the package substrate 10 is decreased, the wirings being opposed to WPP leader wirings connected to the data input pad electrodes CPD[D] or other WPP leader wirings. Thus, crosstalk between the output signal wirings and other WPP leader wirings can be also reduced in a space between the wiring layer L1 and the WPP leader wirings, in which a shield layer is not provided, the crosstalk being due to a wiring as a noise source connected to the BMP[Q] of the wiring layer L1.

Figure 15:
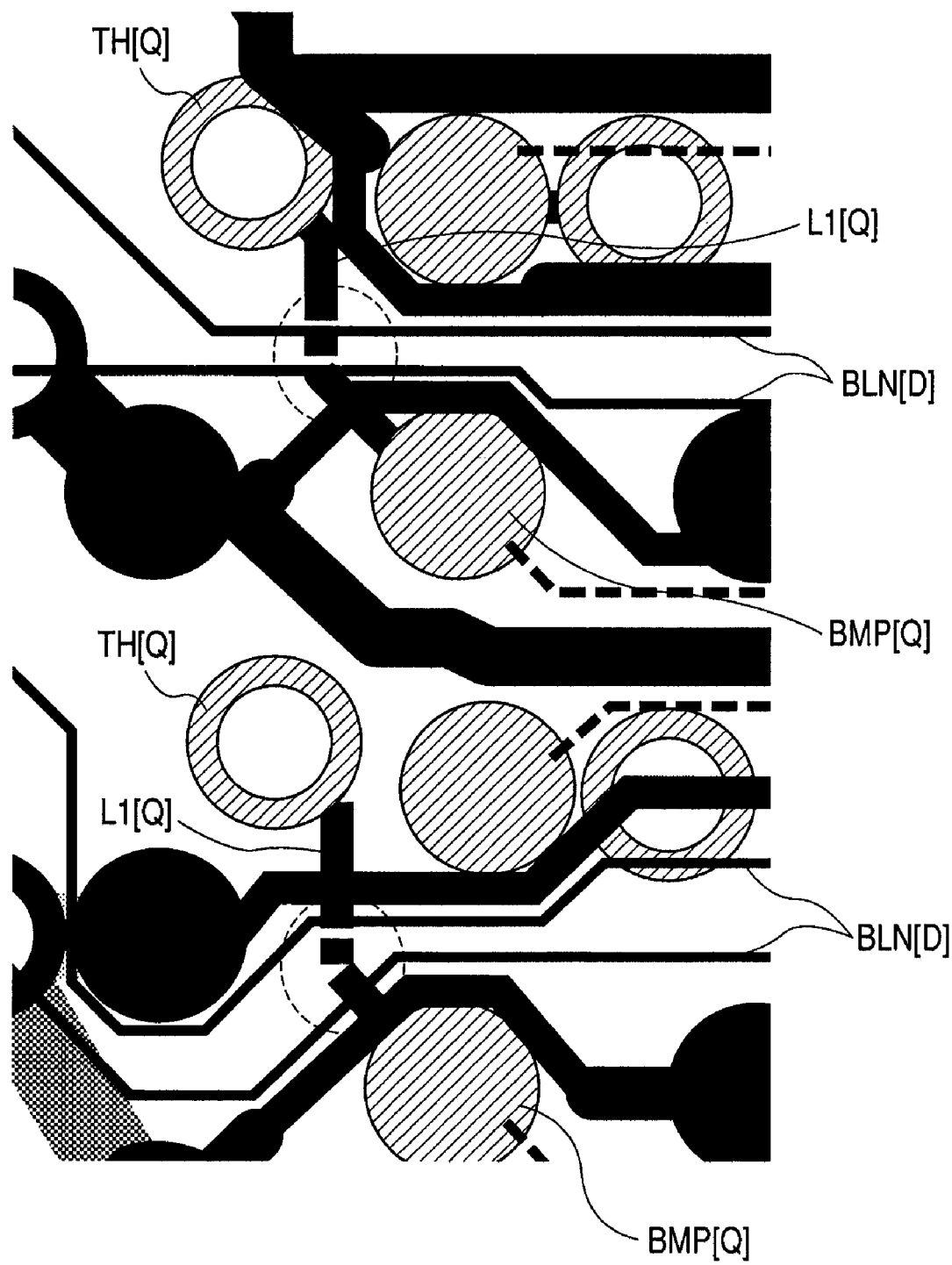
FIG. 15 shows a plan view illustrating a crossing layout on a plane between a wiring of the wiring layer L1 and a WPP leader wiring.

FIG. 15 illustrates a relative, positional relationship on a plane between wirings of the wiring layer L1 and the WPP leader wirings in a portion A2 of FIG. 9. L1[Q] is data output wirings to be connected to the data output bump electrodes BMP[Q] in the wiring layer L1, and BLN[D] is WPP leader wirings to be connected to the data input bump electrodes BMP[D]. As obvious from FIG. 15, the data input WPP leader wirings BLN[D] are in orthogonal layout to the data output wirings L1[Q]. Since mutual inductance between orthogonal conductors may be substantially neglected, crosstalk between them is extremely reduced.

<Allocation of wiring Layers of Power System>

A planar conductor pattern (Vddq plane) PLN[Vddq] for the power voltage for external input/output Vddq is allocated to the wiring layer L2. A planar configuration of the pattern is shown in FIG. 10. A planar conductor pattern (Vss plane) PLN[Vss] for the ground voltage Vss is allocated to the wiring layer L3. A planar configuration of the pattern is shown in FIG. 11. A planar conductor pattern (Vdd plane) PLN[Vdd] for the power voltage Vdd is allocated to the wiring layer L4. A planar configuration of the pattern is shown in FIG. 12.

The Vss plane PLN[Vss] of the wiring layer L3 and the Vddq plane PLN[Vddq] of the wiring layer L2 act as a shield layer to a magnetic field caused by change in current of the external output system signal wirings of the wiring layer L4. Thus, the Vddq plane PLN[Vddq] and the Vdd plane PLN[Vdd] are separated in the wiring layer L2 and the wiring layer L4 via the wiring layer L3, resulting in reduction in effective inductance of respective power supply systems of the power voltage for external input/output Vddq and the external power voltage Vdd. Furthermore, since the Vddq plane PLN[Vddq] formed in the wiring layer L2 configures a return path of a major input signal wiring formed in the wiring layer L1, and the Vss plane PLN[Vss] formed in the wiring layer L3 configures a return path of a major output signal wiring formed in the wiring layer L4, effective inductance of such data output system and data input system can be reduced respectively.

<Layout of Bump Electrodes>

Figure 16:
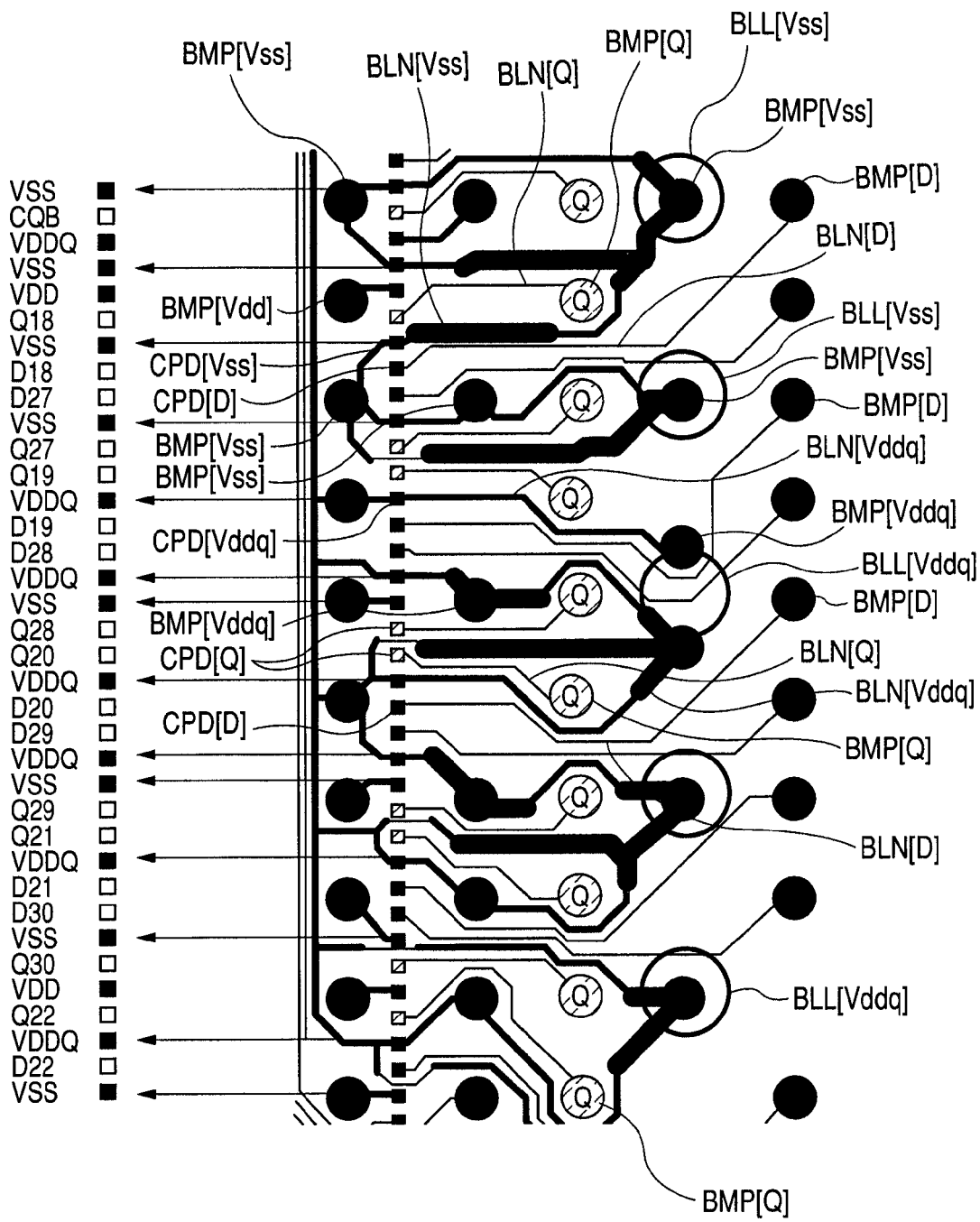
FIG. 16 shows an enlarged view of a portion A1 of FIG. 8.

As obvious from the vertical section structure of FIG. 1 and the planar configuration of FIG. 8, a first array of the pad electrodes CPD, a second array of power supply bump electrodes for external input/output BMP [Vddq] and grand bump electrodes BMP [Vss], a third array of data output bump electrodes BMP [Q], a fourth array of power supply bump electrodes for external input/output BMP [Vddq] and grand bump electrodes BMP [Vss], and a fifth array of data input bump electrodes BMP [D] are sequentially formed in an area from the central portion to the edge portion of the semiconductor integrated circuit 3. FIG. 16 shows an enlarged view of a portion Al of FIG. 8. The power bump electrodes for external input/output BMP [Vddq] or the grand bump electrodes BMP [Vss] are always disposed between the first array of the pad electrodes CPD, third array of data output bump electrodes BMP [Q], and fifth array of data input bump electrodes BMP [D]. Accordingly, leader wirings for ground BLN[Vss] or leader wirings BLN[Vddq] for the power Vddq are easily disposed between leader wirings for data input BLN[D] and leader wirings for data output BLN[Q] adjacent to each other. The leader wirings for ground BLN[Vss] and the leader wirings BLN[Vddq] for the power Vddq act as electromagnetic shield wirings for the leader wirings for data input BLN[D] and the leader wirings for data output BLN[Q] adjacent to each other, consequently crosstalk between the leader wirings for data input BLN[D] and the leader wirings for data output BLN[Q] can be suppressed.

Since the leader wirings for data input BLN[D] and the leader wirings for data output BLN[Q] are disposed such that they are adjacent to the leader wirings for ground BLN[Vss] or the leader wirings BLN[Vddq] for the power Vddq, it is easy that electromagnetically tight coupling between a signal path and a return path thereof is easily made, consequently effective inductance of a signal system can be helped to be reduced.

Since the data output bump electrodes BMP[Q] are disposed near the first array of the pad electrodes CPD compared with the data input bump electrodes BMP[D], leader wirings for output BLN[Q] that may be the noise source can be shortened. Again in this regard, noise resistance is improved.

<Feed Paths Of Vss And Vddq>

Figure 17:
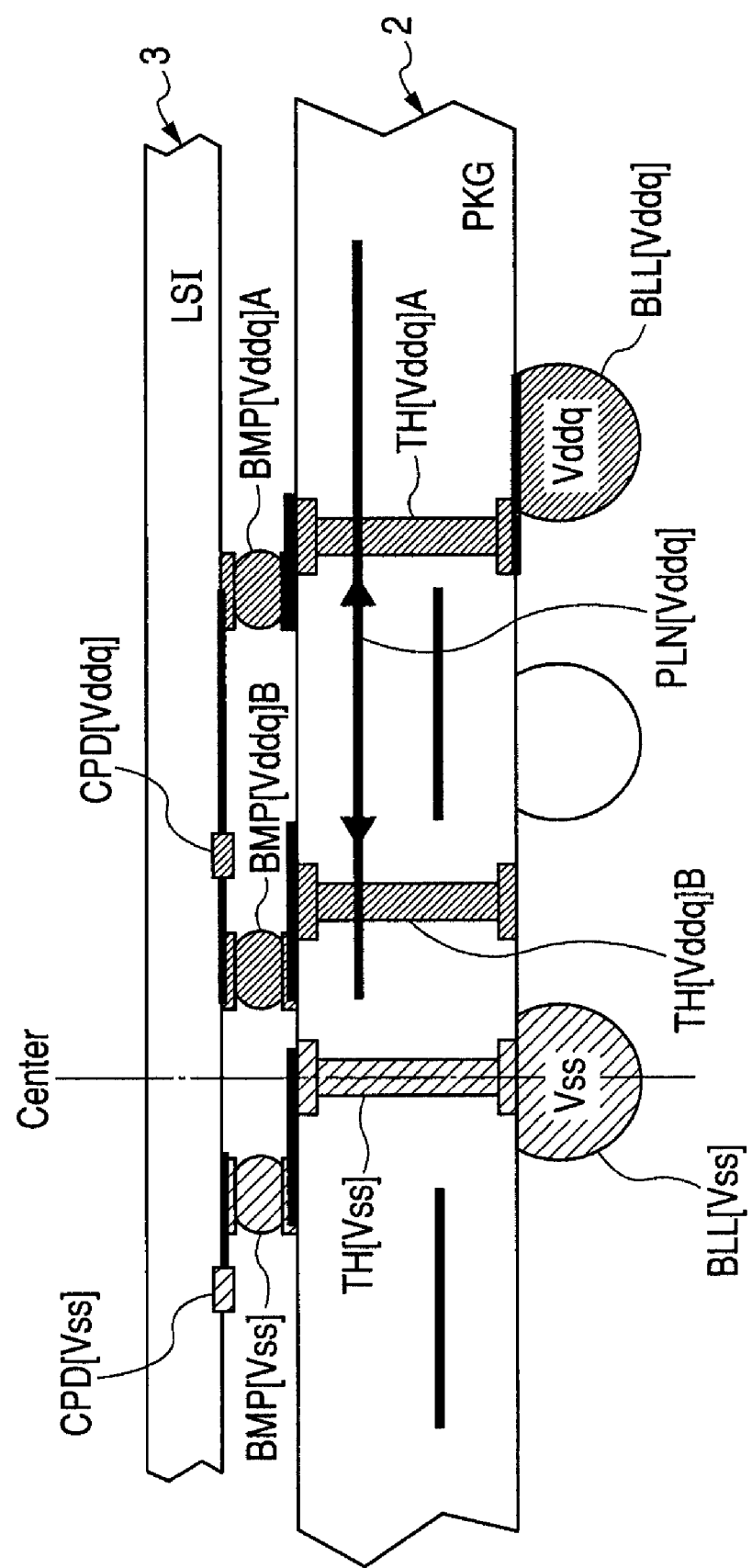
FIG. 17 shows a vertical section view showing feed paths of ground voltage and external input/output power voltage Vddq.

FIG. 17 shows a vertical section structure of feed paths of the ground voltage Vss and the external input/output power voltage Vddq. As shown in FIG. 12, ground ball electrodes BLL[Vss] are disposed in the central portion of the package substrate 2. External input/output power ball electrodes BLL[Vddq] are disposed outside the power plane PLN[Vdd]. Data input ball electrodes BLL[D] and data output ball electrodes BLL[Q] are disposed outside the ball electrodes BLL[Vddq]. FIG. 17 typically shows the ground ball electrodes BLL[Vss] and the external input/output power ball electrodes BLL[Vddq] among them. The external input/output power ball electrode BLL[Vddq] is connected to the power plane PLN[Vddq] of the wiring layer L2 and a wiring L1[Vddq]A of the wiring layer L1 via a through-hole TH[Vddq]A. The wiring L1[vddq]A is connected to a power pad CPD[Vddq] through a WPP leader wiring BLN[Vddq] via a bump electrode BMP[Vddq]A. A through-hole TH[Vddq]B that is not coupled with the external input/output power ball electrode BLL[Vddq] is formed near the central portion of the package substrate 2, and the through-hole TH[Vddq]B is connected to the power pad CPD[Vddq] through the WPP leader wiring BLN[Vddq], similarly as above, via a wiring L1[Vddq]B a bump electrode BMP[Vddq] B. The feed path via the through-hole TH[Vddq]A is entirely for forming a shield wiring BLN[Vddq], as clear by seeing FIG. 16. When feed is tried to be performed only by the shield wiring BLN[vddq], self-inductance of the relevant path is excessively increased, resulting in significant difference in electromagnetic characteristic compared with a feed path of the ground voltage Vss that is to be a return path. The feed path via the through-hole TH[Vddq]B is for equalizing electromagnetic characteristics to a feed path of the ground voltage Vss via the power plane PLN[Vddq]. In other word, a current path having small impedance is secured by the power plane PLN[Vddq], as easily understood by FIG. 10. Again in this regard, effective inductance between paths of the power voltage Vddq and the ground voltage Vss can be reduced.

Figure 18:
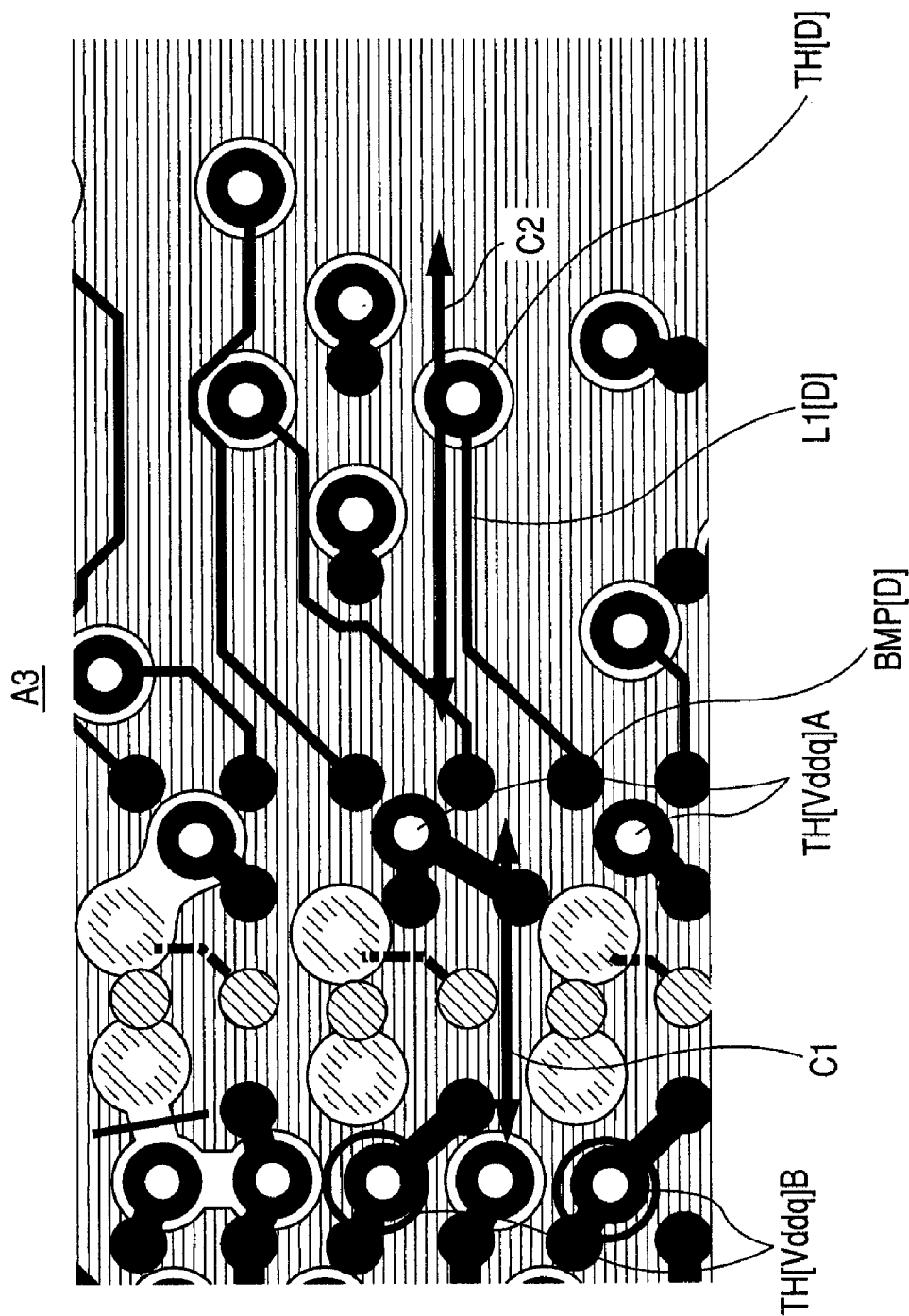
FIG. 18 shows a plan view illustrating a relationship between a direction of current on a power plane PLN[Vddq] and a wiring direction of an external input data wiring L1[D]

In particular, as illustrated in FIG. 18, a direction of current from the through-hole TH[Vddq]A to the through-hole TH[Vddq]B on the power plane PLN[Vddq] is made partially parallel to a direction of an external input data wiring L1[D] in the wiring layer L1. This operates to reduce effective inductance between an input signal and a return path thereof.

<Degree of Freedom of Layout of Through-Holes>

The described through-holes for external output data TH[Q] in FIG. 14, through-holes for Vss TH[Vss] in FIG. 17, and through-holes TH[Vddq] used for feed of power Vddq similarly in FIG. 17 are desirably formed near the center of the package 2, as clear from the above description. Description will be made on a configuration where the degree of freedom of through-hole formation is increased in this sense.

Figure 19:
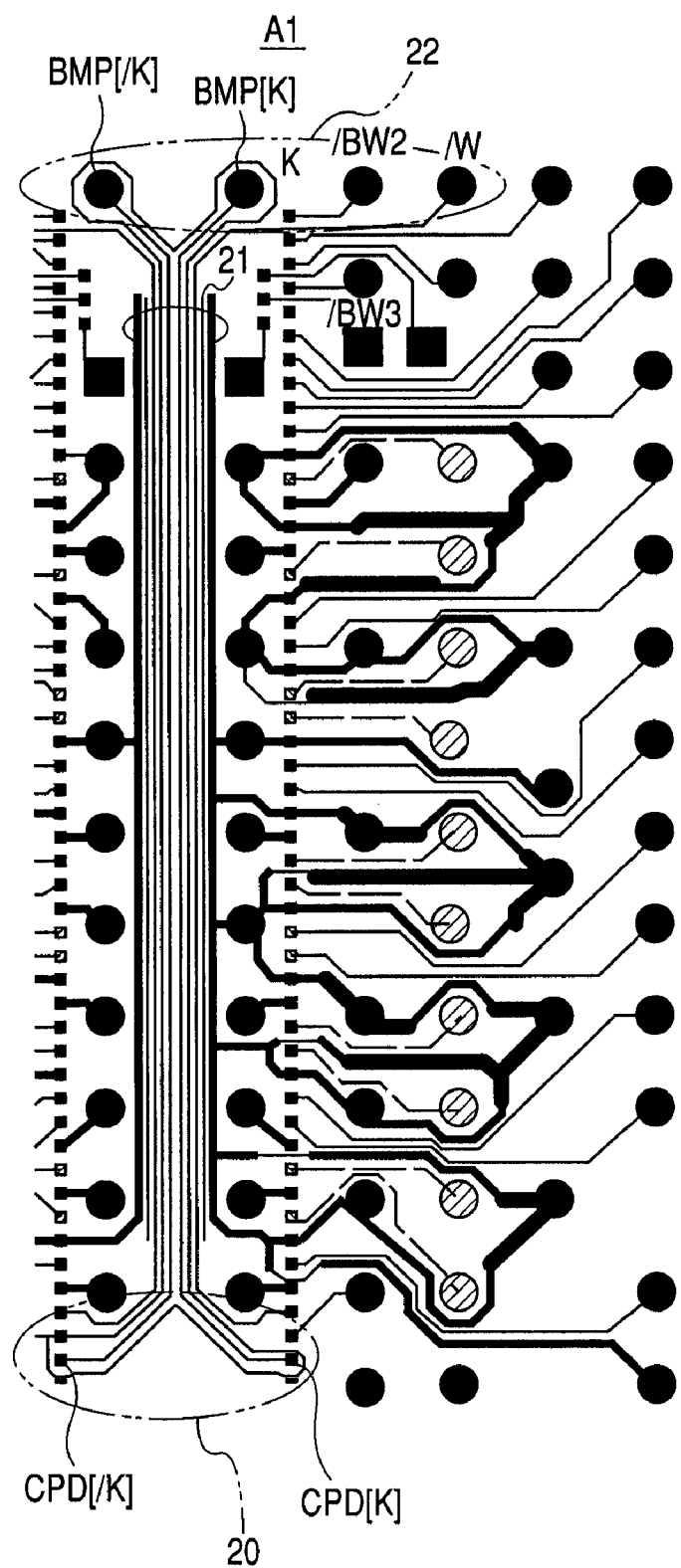
FIG. 19 shows a plan view showing a configuration where WPP leader wirings to be connected to a plurality of pad electrodes CPD of a clock or command system are formed in a central portion of a chip.
Figure 20:
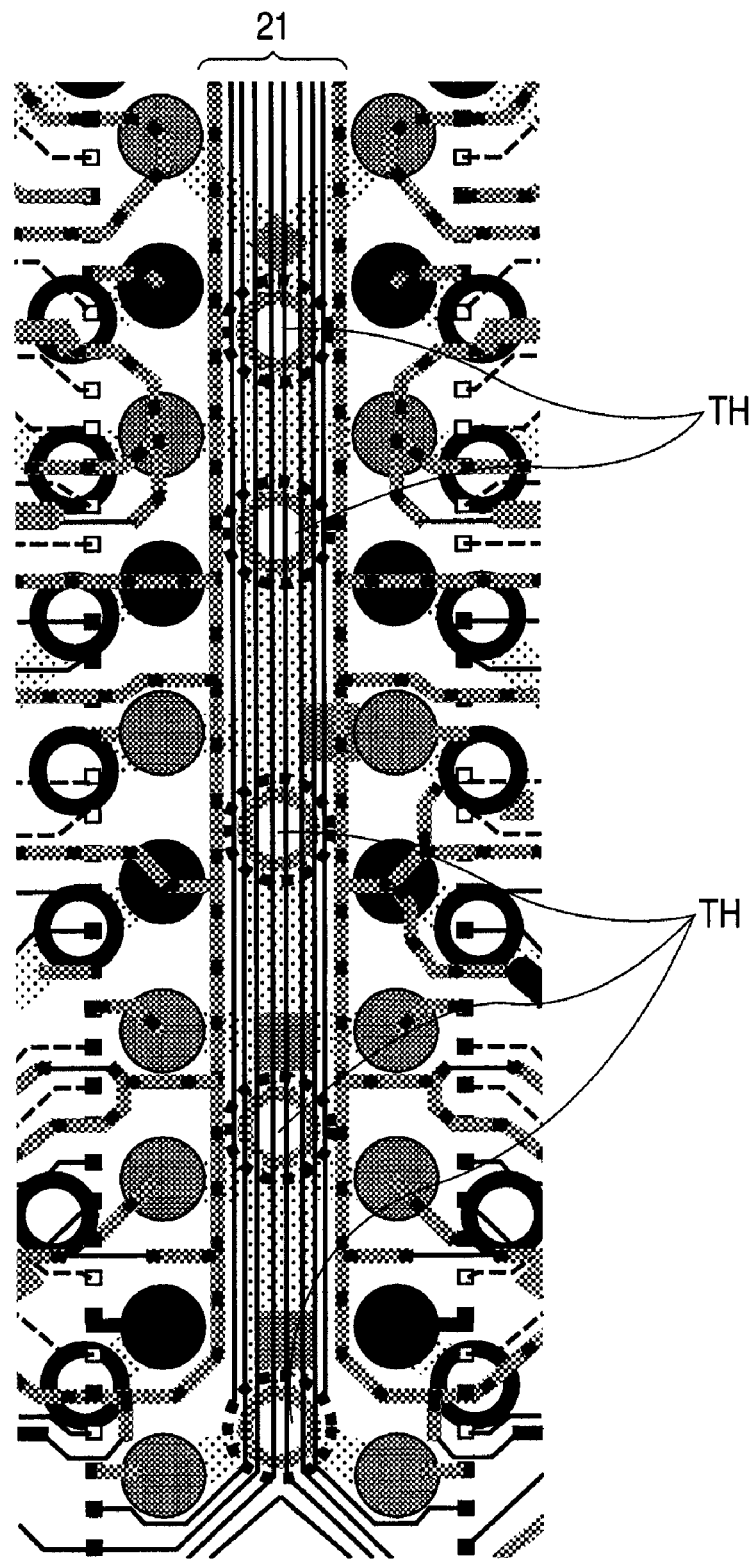
FIG. 20 shows a plan view showing a condition where through-holes TH for ground voltage Vss are formed in a central portion of the package substrate overlapped with the WPP leader wirings in the central portion of the chip.

To increase the degree of freedom of through-hole formation in the central portion of the package substrate 2, the inventor noted difference between a layout of pad electrodes of a clock or command system in the semiconductor integrated circuit, and a layout of ball electrodes for such signals in the package. The pad electrodes of the clock or command system in the semiconductor integrated circuit are typically arranged in the central portion of the chip. This is on the basis of consideration of an issue of wiring length for clock or the like. In most cases, the ball electrodes for the signals in the package are typically disposed in ends of the package substrate. Therefore, when the wiring layers of the package substrate are used for connecting both of the electrodes, the wirings in the central portion of the package substrate needs to be largely used. This reduces the degree of freedom of through-hole formation in the central portion of the package substrate. As shown in FIG. 19 as an enlarged view of the portion A1 in FIG. 8, WPP leader wirings 20 are used for connection between the pad electrodes CPD of the clock or command system in the semiconductor integrated circuit 3, and ball electrodes BLL for the signals in the package substrate 2. In FIG. 19, a group 20 of a plurality of pad electrodes CPD of the clock or command system is connected to a group 22 of a plurality of corresponding bump electrodes BM in a chip end via WPP leader wirings 21 formed in the central portion of the chip. Input clock signals K, /K are illustrated as clock signals. While not shown, a central portion of the lower half of FIG. 8 is similarly configured, and WPP leader wirings such as output clock signals C, /C are formed here. Therefore, as illustrated in FIG. 20, through-holes TH for ground Vss or the like can be formed in the central portion of the package substrate 2 to be overlapped with the WPP leader wirings 20.

Figure 21:
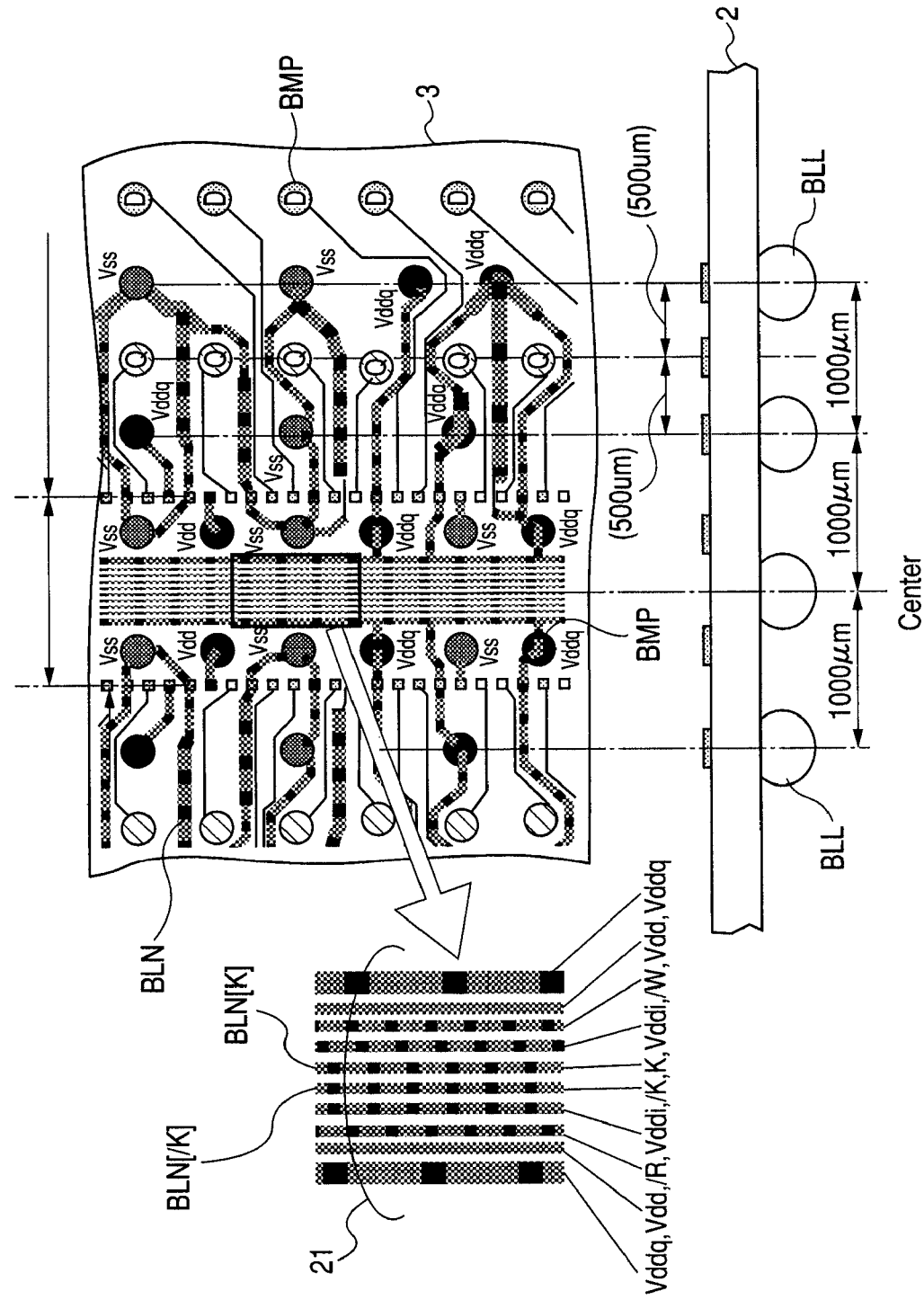
FIG. 21 shows a plan view showing a condition where the ball electrodes BLL are disposed in matrix at a constant pitch, and the bump electrodes BMP are disposed such that they are overlapped with the ball electrodes, or disposed at a pitch half the pitch of the ball electrodes.
Figure 22:
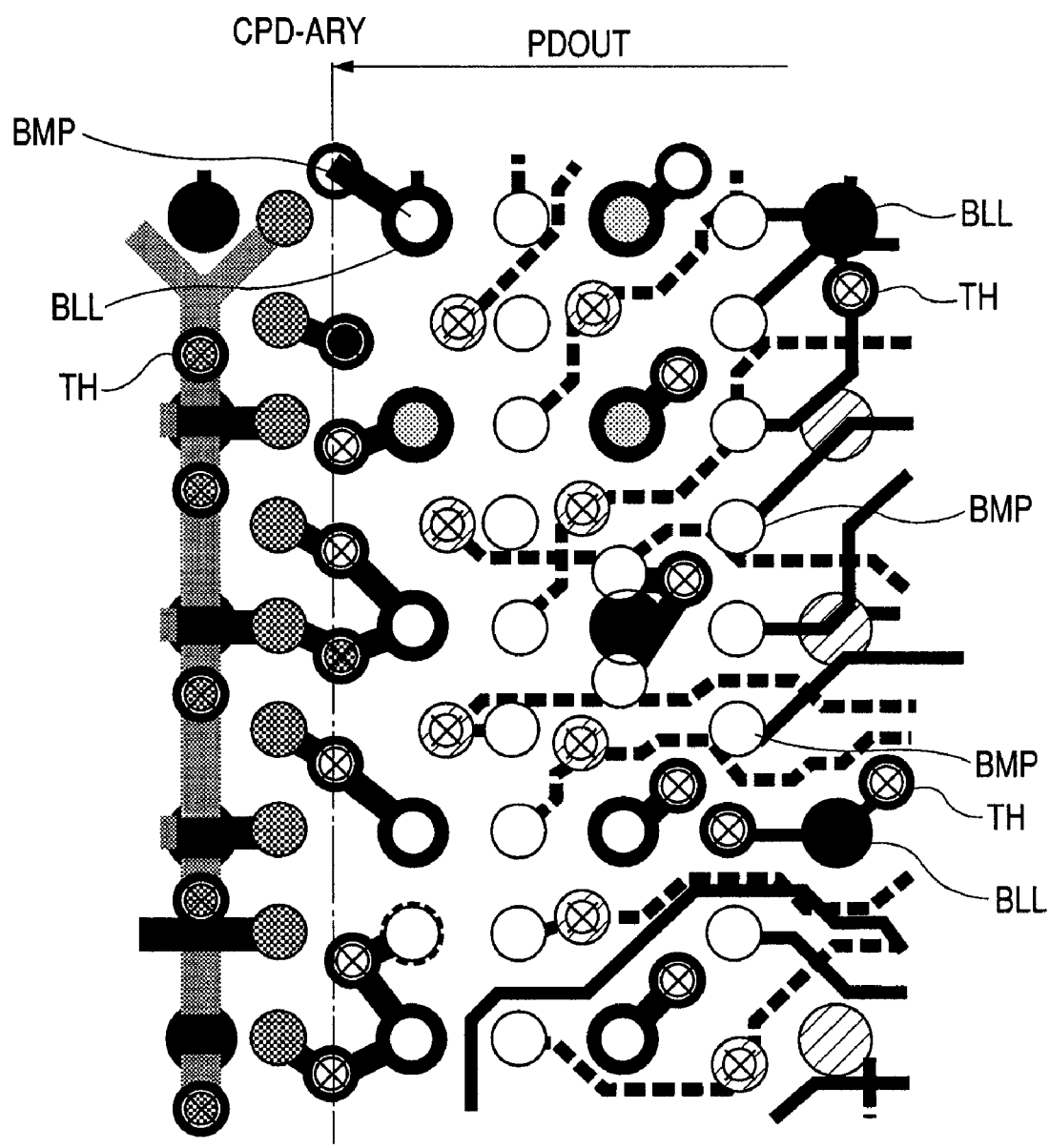
FIG. 22 shows a plan view generally showing an example of a layout of the ball electrodes BLL, through-holes TH, and bump electrodes BMP.

To increase the degree of freedom of through-hole formation in horizontally outside regions PDOUT of the package substrate 2, as illustrate in FIG. 21, the ball electrodes BLL are disposed in matrix at a constant pitch (for example, 1000 μm), and the bump electrodes BMP are disposed such that they are overlapped with the ball electrodes, or disposed at a pitch half the pitch of the ball electrodes. The through-holes TH can not be formed at positions where they are overlapped with the bump electrodes BMP or the ball electrodes BLL. Area of a region where the through-holes TH can be formed is increased by area of a region where the ball electrodes BLL are overlapped with the bump electrodes BMP in plane. Therefore, the degree of freedom is increased to formation regions of through-holes TH compared with a case where the bump electrodes BMP and the ball electrodes BLL are randomly disposed, consequently the number of formable through-holes is easily increased. In FIG. 13, AR[TH] is a through-hole formable region. A boundary of an outside region PDOUT corresponds to an array of pad electrodes PD of the chip. In an inside region PDIN of left and right arrays of pad electrodes PD, the bump electrodes BMP are disposed just proximal to the ball electrodes BLL. FIG. 22 shows an example of a layout of the ball electrodes BLL, through-holes TH, and bump electrodes BMP.

FIG. 21 illustrates the WPP leader wirings 21 for each signal type or power type. The reason why the WPP leader wirings 21 includes wirings of Vddq, Vdd and Vddi is merely because the WPP leader wirings are partially used in the interest of chip inside design.

<Evaluation and Correction>

Figure 25:
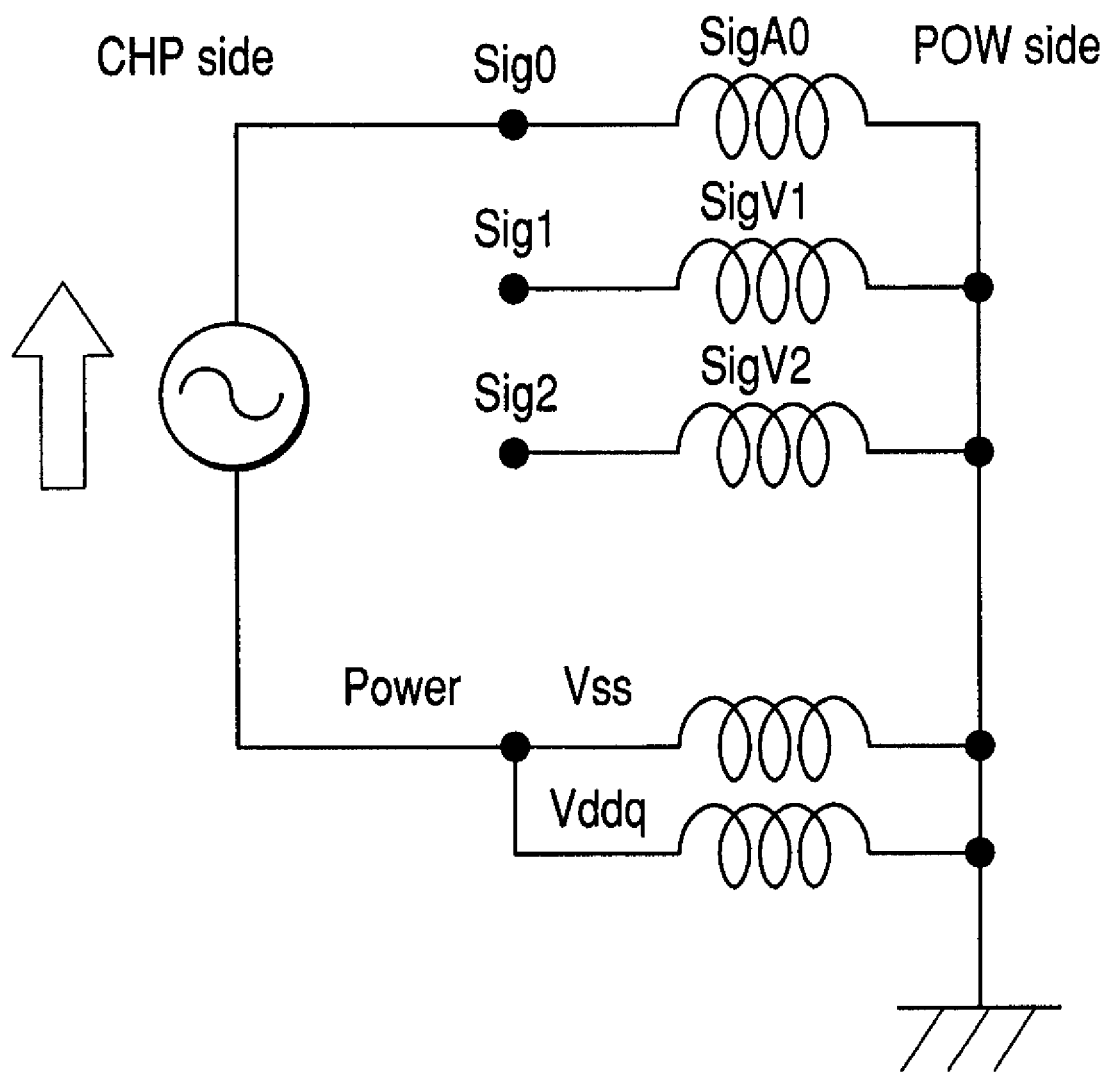
FIG. 25 shows a circuit diagram schematically showing a simulation object circuit for obtaining a mutual inductance matrix.
Figure 26:
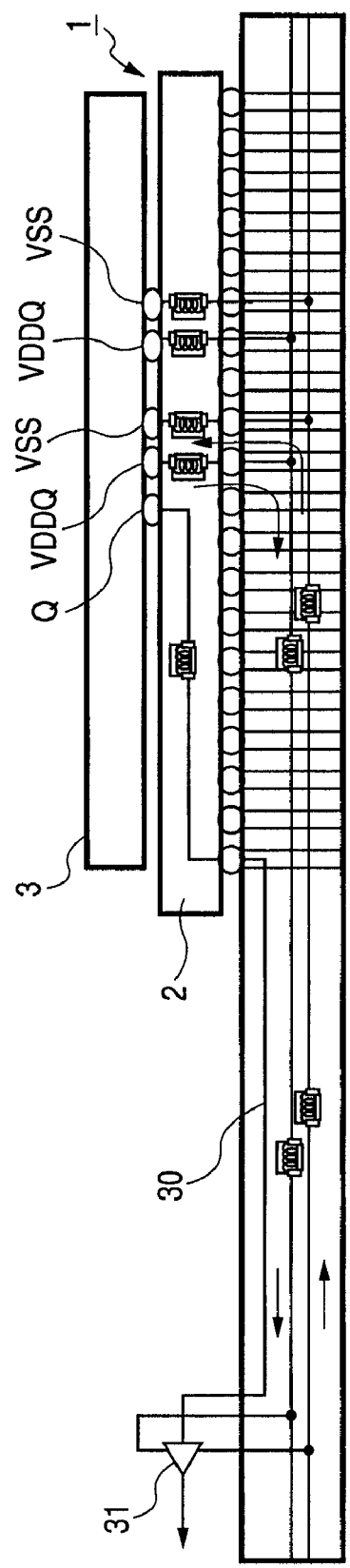
FIG. 26 shows a schematic section view showing an example of connection with a tester board when a minimum amplitude value Dmin of QDR-SRAM 1 is measured using the tester board.
Figure 27:
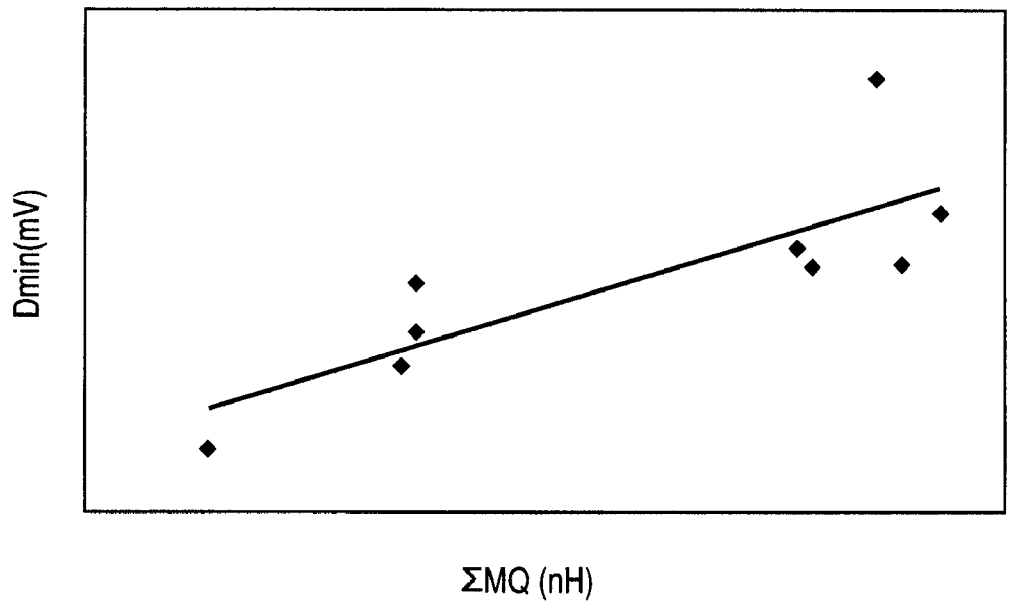
FIG. 27 shows a characteristic diagram showing tendency that the minimum amplitude value Dmin is increased with increase in value of ΣMQ.
Figure 28:
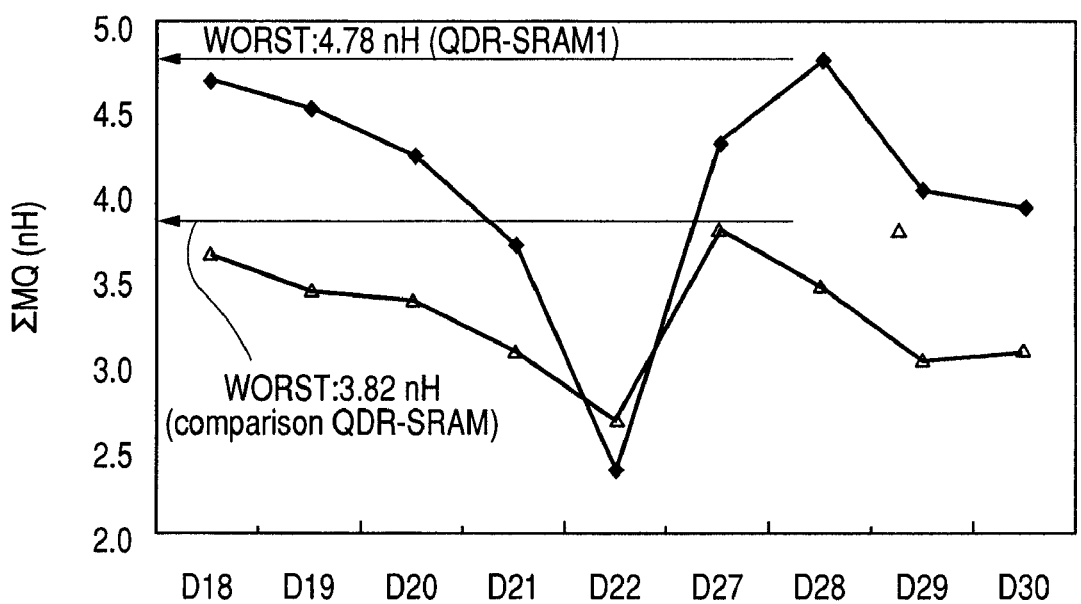
FIG. 28 shows an explanatory view showing difference in ΣMQ between QDR-SRAM of the embodiment of the invention and QDR-SRAM of the comparative example.

Evaluation was performed on influence of change in output in data parallel input/output of the QDR-SRAM 1 upon input data. The evaluation is performed in a manner that a particular output pin is assumed as a noise source, then simulation of evaluating change in voltage of all input pins due to the noise source is performed, and such operation is repeated for all output pins, thereby an effective mutual inductance matrix as illustrated in FIG. 23 is produced. That is, influence of change in a particular output pin upon each input was calculated for all the output pins by simulation as effective mutual inductance matrix. FIG. 25 schematically shows a simulation object circuit. In FIG. 25, Sig0 at a chip side (CHP side) is an output pin at the chip side as the noise source, and Sig1, Sig2 . . . are input pins. Paths of Vss and Vddq are considered for a power system as a return path from a power side (POW side) compared with a signal system. FIG. 23 shows a simulation result for output pins of Q18 to Q30 and input pins of D18 to D30. For example, the result shows that change in current of the output pin Q18 is given to the input pin D18 as noise voltage in proportion to mutual inductance 0.98 nH, and given to the input pin D19 as noise voltage in proportion to mutual inductance 0.37 nH. ΣMQ implies the total sum of absolute values of effective mutual inductance corresponding to that of all output pins and power for a particular input pin. Here, as illustrated in FIG. 26, the QDR-SRAM 1 was mounted on a tester board 30, then read/write was sequentially repeated while signal amplitude is gradually reduced, and whether read data inputted from a tester receiver 31 were correct was determined, and a minimum amplitude value Dmin at which a data error did not occur was concurrently measured. At that time, as illustrated in FIG. 27, it was clarified by investigation of the inventor that as a value of ΣMQ was increased, the minimum amplitude value Dmin was apt to be increased. That is, electromagnetic noise resistance is reduced with increase in the minimum amplitude value Dmin, and the inventor found that the value of ΣMQ provides an indication of the electromagnetic noise resistance, and decreasing the value of ΣMQ was important to reduce the minimum amplitude value Dmin. From the viewpoint, ΣMQ=3.82 nH for the input pin D27 is the worst in the effective inductance matrix of FIG. 23. FIG. 24 illustrates an effective mutual inductance matrix in the case of QDR-SRAM (comparison QDR-SRAM) that did not use the WPP structure and the characteristic structure of the package substrate described hereinbefore as a comparative example. The worst value is ΣMQ=4.78 nH in the comparative example, consequently improvement of about 1 nH is achieved in the QDR-SRAM 1 according to the embodiment of the invention of the application. FIG. 28 shows difference in ΣMQ between both kinds of QDR-SRAM.

Figure 30:
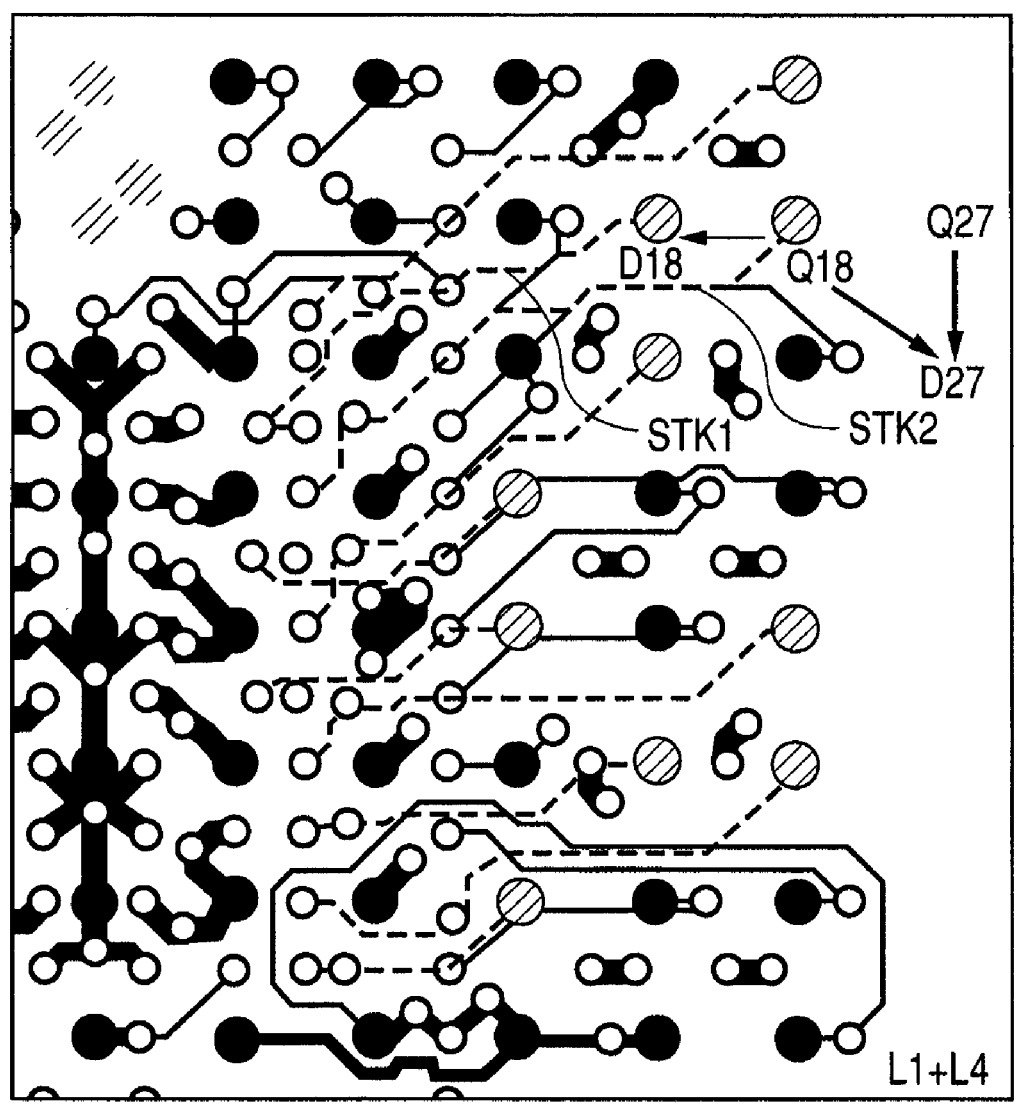
FIG. 30 shows a plan view showing an aspect viewed through the wiring layer L1 and the wiring layer L4.
Figure 31:
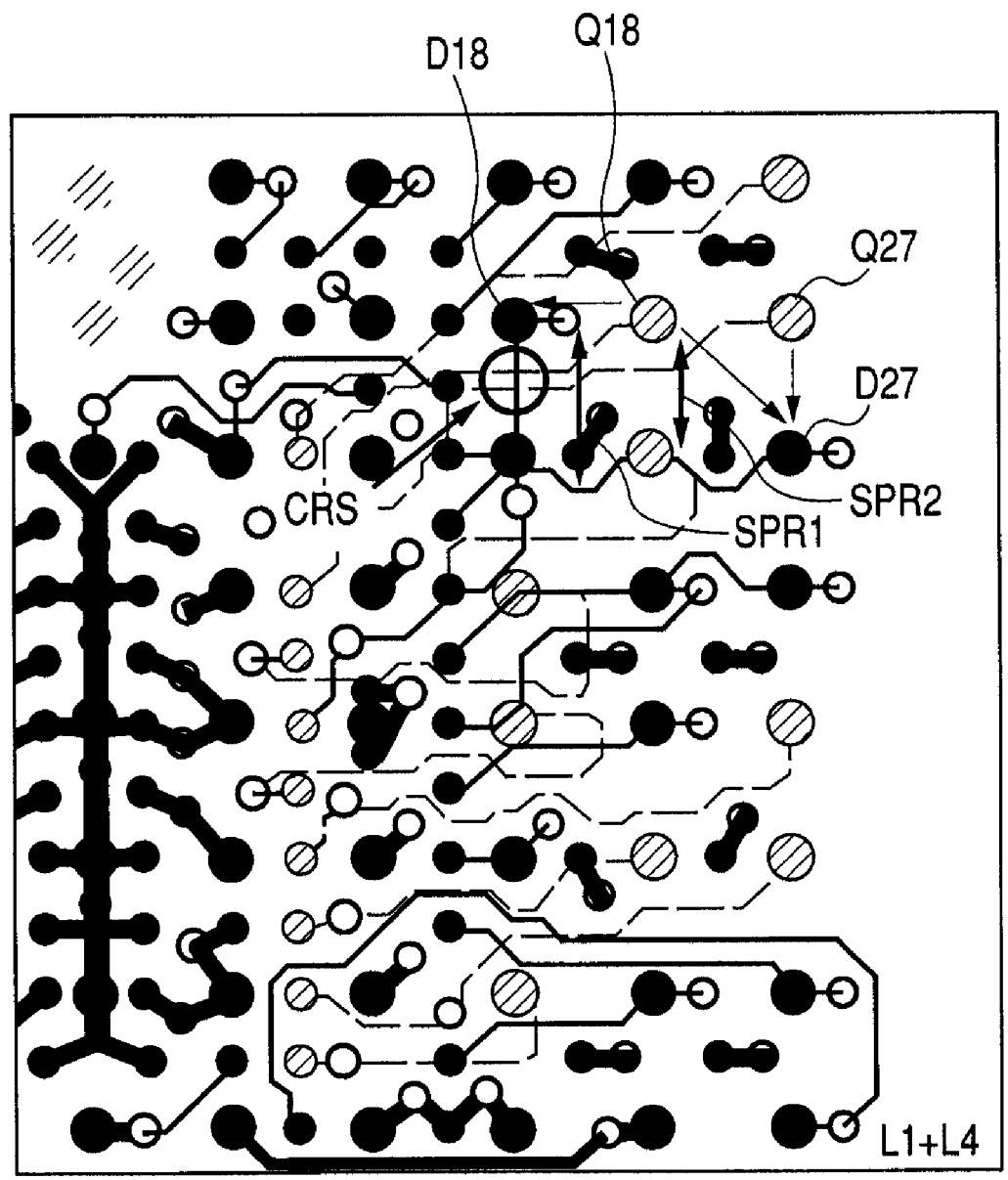
FIG. 31 shows a plan view showing a condition where a layout is corrected such that a wiring to be connected to the pin D18 is spaced from a wiring to be connected to the pin Q18, and a wiring to be connected to the pin D27 is spaced from a wiring to be connected to the pin Q27, and furthermore the wirings are crossed with each other respectively.
Figures 32, 33:
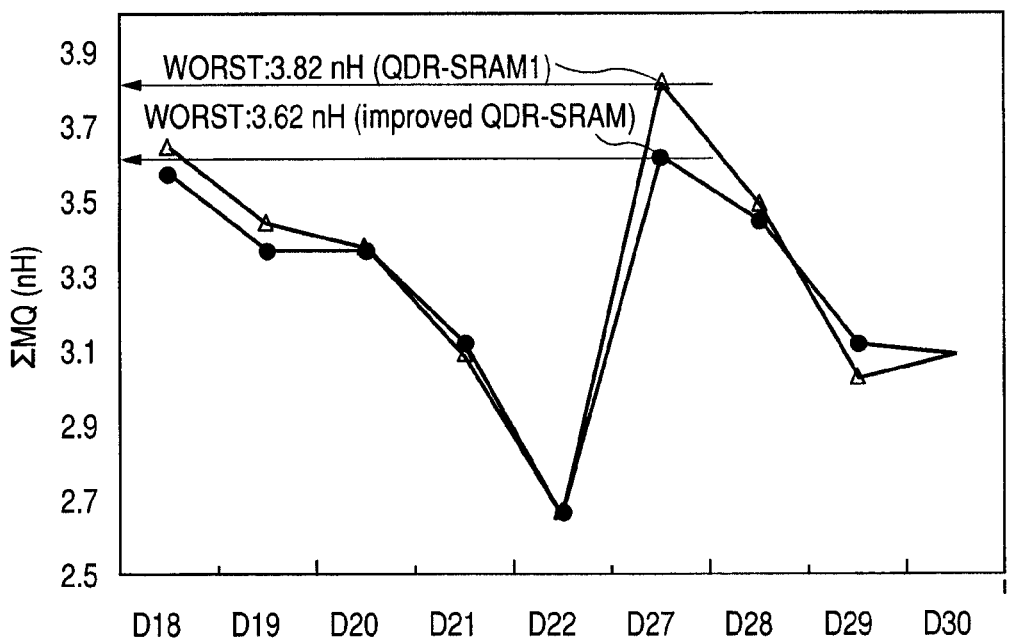
FIG. 32 shows an explanatory view illustrating a result of improvement by correction of FIG. 31.
FIG. 33 shows an explanatory view showing difference in ΣMQ between both kinds of QDR-SRAM before and after improvement of FIG. 31.

Furthermore, the inventor examined the effective mutual inductance matrix of FIG. 23. As a result, the inventor noted input pins D18, D27 situated at an edge side of the package substrate, the input pins having comparatively large ΣMQ. As obviously shown in FIG. 29, it is known that the input pins D18 and D27 are large in mutual inductance with nearest output pins Q18 and Q27. As a reason for this, crosstalk between adjacent input and output pins is considered. FIG. 30 shows an aspect viewed through the wiring layer L1 and the wiring layer L4. It is known from this that a wiring to be connected to the pin D18 is vertically overlapped with a wiring to be connected to the pin Q18 in a portion STK1, and a wiring to be connected to the pin D27 is vertically overlapped with a wiring to be connected to the pin Q27 in a portion STK2. Thus, as illustrated in FIG. 31, the wiring to be connected to the pin D18 is spaced from the wiring to be connected to the pin Q18 by a portion SPR1, and the wiring to be connected to the pin D27 is spaced from the wiring to be connected to the pin Q27 by a portion SPR2, and furthermore, orthogonal wiring is employed in an area where wirings cross each other, as a portion CRS. An improvement result by this is illustrated in FIG. 32. While it is slight, the maximum value of ΣMQ can be decreased by 0.2 nH compared with that before improvement. FIG. 33 shows difference in ΣMQ between both kinds of QDR-SRAM before and after improvement.

While the invention made by the inventor has been specifically described according to the embodiment hereinbefore, the invention is not limited to it, and it will be obvious that the various alteration or modification can be made within a scope without departing from the gist of the invention.

For example, the semiconductor integrated circuit is not limited to the QDR-SRAM, and may be other data processing LSI such as different memory, microcomputer, and accelerator. The object of parallel input/output is not limited to data. For example, output data and an input command, or output data and an input address may be used. The semiconductor integrated circuit is not limited to the circuit having the WPP structure. The package substrate is not limited to the substrate having the BGA structure, and is not limited to the composite wiring substrate in four layers.

What is claimed is:

1. A semiconductor device having a package substrate and a semiconductor integrated circuit mounted on the package substrate,
    wherein the package substrate includes an upper surface and a lower surface opposed to the upper surface,
    wherein the semiconductor integrated circuit includes a front surface, a plurality of external connection terminals formed on the front surface, and a back surface opposed to the front surface, and is mounted on the upper surface of the package substrate such that the front surface of the semiconductor integrated circuit faces to the upper surface of the package substrate,
    wherein the plurality of external connection terminals include an external input terminal, an external output terminal, an external ground terminal, an external input/output power terminal, and an external power terminal,
    wherein the external input terminal and an external output terminal are able to input/output external data in parallel to each other,
    wherein the package substrate includes a plurality of module terminals arranged on the lower surface of the package substrate in an array and electrically connecting with the plurality of external connection terminals,
    wherein the package substrate includes a plurality of wiring layers having wiring patterns for electrically connecting the plurality of external connection terminals and the plurality of module terminals,
    wherein a first wiring layer of the plurality of wiring layers is formed on the upper surface of the package substrate, and has a first wiring for electrically connecting the external input terminal and a first module terminal of the plurality of module terminals, and
    wherein a second wiring layer of the plurality of wiring layers is formed on the lower surface of the package substrate, and has a second wiring for electrically connecting the external output terminal and a second module terminal of the plurality of module terminals.

2. The semiconductor device according to claim 1,
    wherein one of the external ground terminal, the external input/output power terminal, and the external power terminal is disposed between the external input terminal and the external output terminal.

3. The semiconductor device according to claim 1,
    wherein a third wiring layer of the plurality of wiring layers, including a first planar conductor pattern electrically connected with the external ground terminal, and a fourth wiring layer of the plurality of wiring layers, including a second planar conductor pattern electrically connected with the external input/output power terminal, are formed between the first wiring layer and the second wiring layer.

4. The semiconductor device according to claim 3, wherein the third wiring layer is disposed between the second wiring layer and the fourth wiring layer.

5. The semiconductor device according to claim 1, wherein the second wiring layer has a third planar conductor pattern electrically connected with the external power terminal.

6. The semiconductor device according to claim 1, wherein the semiconductor integrated circuit includes a semiconductor chip and a plurality of leader wirings, and
wherein pad electrodes exposed from a surface protection film of the semiconductor chip are electrically connected with the plurality of external connection terminals via the plurality of leader wirings.

7. The semiconductor device according to claim 6, wherein one of the leader wirings is electrically connected with the external input terminal and is perpendicular to a wiring of the first wiring layer electrically connected with the external output terminal.

8. The semiconductor device according to claim 6, wherein the plurality of external connection terminals include a first external clock input terminal and a second external clock input terminal,
wherein the first external clock input terminal inputs a clock signal for synchronizing output operation of data outputted from the external output terminal, and
wherein the second external clock input terminal inputs a clock signal for synchronizing input operation of data inputted from the external input terminal.

9. The semiconductor device according to claim 8, wherein a first leader wiring for clock coupling with the first external clock input terminal and a second leader wiring for clock coupling with the second external clock input terminal are electrically connected with the pad electrodes by crossing a central portion of the semiconductor chip.

10. The semiconductor device according to claim 9, wherein a plurality of through-holes for connecting between wirings of different wiring layers are formed at positions overlapping with the first leader wiring for clock and the second leader wiring for clock.

11. The semiconductor device according to claim 10, wherein a pitch between the plurality of external connection terminals adjacent to each other is half of a pitch between the module terminals adjacent to each other, and
wherein some of the plurality of external connection terminals are overlapped with the plurality of module terminals in a thickness direction of the package substrate.

12. A semiconductor device having a package substrate and a semiconductor integrated circuit mounted on the package substrate,
wherein the package substrate includes an upper surface and a lower surface opposed to the upper surface,
wherein the semiconductor integrated circuit includes a semiconductor chip having a front surface, a surface protection film formed on the front surface, pad electrodes exposed from the surface protection film, a plurality of external connection terminals electrically connecting with the pad electrodes via a plurality of leader wirings, and a back surface opposed to the front surface, and is mounted on the upper surface of the package substrate such that the front surface of the semiconductor integrated circuit faces the upper surface of the package substrate,
wherein the plurality of external connection terminals include external input terminals, external output terminals, external ground terminals, external power terminals, and external input/output power terminals,
wherein the external input terminals and the external output terminals are able to input/output external data in parallel to each other,
wherein the external input/output power terminals are for supplying operation power to a circuit coupling with the external output terminals and the external input terminals,
wherein a planar shape of the semiconductor integrated circuit is a quadrangle including a short side and a long side crossing the short side, and
wherein the pad electrodes are arranged in a first row located between a central part of the semiconductor integrated circuit and the long side of the semiconductor integrated circuit in a plan view, first ones of the external input/output power terminals and the external ground terminals are arranged in a second row located between the first row and the long side in a plan view, the external output terminals are arranged in third row located between the second row and the long side in a plan view, second ones of the external input/output power terminals and the external ground terminal are arranged in a fourth row located between the third row and the long side in a plan view, and the external input terminals are arranged in a fifth row located between the fourth row and the long side in a plan view.

13. The semiconductor device according to claim 12, wherein third ones of the external ground terminals and the external power terminals are arranged in a sixth row located between the first row and the central part in a plan view.

14. The semiconductor device according to claim 13, wherein a leader wiring electrically connected with one of the external input/output power terminals is arranged in a region between a leader wiring electrically connected with one of the external output terminals and a leader wiring electrically connected with one of the external input terminals.

15. The semiconductor device according to claim 14, wherein a leader wiring electrically connected with to be connected to one of the external ground terminals is arranged in the region between the leader wiring electrically connected with one of the external output terminals and the leader wiring electrically connected with one of the external input terminals.

16. The semiconductor device according to claim 13, wherein a leader wiring electrically connected with one of the external input terminals is perpendicular to a wiring of the first wiring layer electrically connected with one of the external output terminals.

17. The semiconductor device according to claim 13, wherein the package substrate includes a plurality of module terminals arranged on the lower surface of the package substrate in an array, and electrically connecting with the plurality of external connection terminals,
wherein the package substrate includes a plurality of wiring layers having wiring patterns for electrically connecting the plurality of external connection terminals and the plurality of module terminals,
wherein, a first wiring layer of the plurality of wiring layers is formed on the upper surface of the package substrate, and has a first wiring for electrically connecting the external input terminal and a first module terminal of the plurality of module terminals, and wherein a second wiring layer of the plurality of wiring layers is formed on the lower surface of the package substrate, and has a second wiring for electrically connecting the external output terminal and a second module terminal of the plurality of module terminals.

18. The semiconductor device according to claim 17, wherein a third wiring layer of the plurality of wiring layers including a first planar conductor pattern electrically connected with the external ground terminal and a fourth wiring layer of the plurality of wiring layers including a second planar conductor pattern electrically connected with the external input/output power terminal are formed between the first wiring layer and the second wiring layer.

19. The semiconductor device according to claim 18, wherein the second wiring layer further has a third planar conductor pattern electrically connected with the external power terminals, and the third wiring layer is arranged between the second wiring layer and the fourth wiring layer.

20. The semiconductor device according to claim 13, wherein the plurality of external connection terminals include a first external clock input terminal inputting a clock signal for synchronizing output operation of data outputted from the external output terminal, and a second external clock input terminal inputting a clock signal for synchronizing input operation of data inputted from the external input terminal, and wherein the semiconductor integrated circuit can be operated as a static random access memory.

* * * * *